US012476226B1

(12) United States Patent
Osawa et al.

(10) Patent No.: US 12,476,226 B1
(45) Date of Patent: Nov. 18, 2025

(54) DISPLAY DEVICE HAVING LIGHT EMITTING ELEMENT IN CONCAVE PORTION OF INSULATING SUBSTRATE

(71) Applicant: Japan Display Inc., Tokyo (JP)

(72) Inventors: Shuichi Osawa, Tokyo (JP); Yoshikatsu Imazeki, Tokyo (JP); Yoichi Kamijo, Tokyo (JP); Koichi Miyasaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 544 days.

(21) Appl. No.: 17/951,233

(22) Filed: Sep. 23, 2022

Related U.S. Application Data

(63) Continuation of application No. PCT/JP2021/000866, filed on Jan. 13, 2021.

(30) Foreign Application Priority Data

Mar. 26, 2020 (JP) .................................. 2020-056411

(51) Int. Cl.
*H01L 25/075* (2006.01)
(52) U.S. Cl.
CPC ...... *H01L 25/0756* (2013.01); *H01L 25/0753* (2013.01)
(58) Field of Classification Search
CPC .................................................. H01L 25/0756
USPC ......................................................... 257/88
See application file for complete search history.

(56) References Cited

U.S. PATENT DOCUMENTS

| 2009/0001391 | A1* | 1/2009 | Ogihara | ................... | G09F 9/33 257/89 |
| 2012/0113621 | A1* | 5/2012 | Lee | ................... | F21V 5/10 156/245 |
| 2014/0110726 | A1* | 4/2014 | Naijo | ................... | H10K 59/353 438/34 |
| 2015/0351207 | A1 | 12/2015 | Tung et al. | | |

(Continued)

FOREIGN PATENT DOCUMENTS

| CN | 103646620 A | 3/2014 |
| JP | 2009-010272 A | 1/2009 |
| JP | 2012-104397 A | 5/2012 |

(Continued)

OTHER PUBLICATIONS

International Search Report issued in International Patent Application No. PCT/JP2020/000866 on Mar. 23, 2021 and English translation of same. 6 pages.

(Continued)

*Primary Examiner* — Eliseo Ramos Feliciano
*Assistant Examiner* — Mikka Liu
(74) *Attorney, Agent, or Firm* — K&L Gates LLP

(57) ABSTRACT

According to one embodiment, a display device includes, a first insulating substrate including a first surface and a second surface, a first light emitting element disposed on the second surface, a second insulating substrate including a third surface and a fourth surface, and a second light emitting element disposed on the second insulating substrate, wherein the second insulating substrate includes a first concave portion in the third surface, at least a part of the first light emitting element is positioned inside the first concave portion, and at least a part of the second light emitting element is positioned inside the second concave portion.

20 Claims, 27 Drawing Sheets

(56) References Cited

U.S. PATENT DOCUMENTS

| | | | | |
|---|---|---|---|---|
| 2016/0190399 A1* | 6/2016 | Abe | ..................... | H10H 20/854 |
| | | | | 257/734 |
| 2017/0062674 A1* | 3/2017 | Kwon | .................. | H10H 20/812 |

FOREIGN PATENT DOCUMENTS

| | | |
|---|---|---|
| JP | 2017-116887 A | 6/2017 |
| JP | 2018-010169 A | 1/2018 |

OTHER PUBLICATIONS

Written Opinion issued in International Patent Application No. PCT/JP2021/000866 on Mar. 23, 2021. 4 pages.

\* cited by examiner

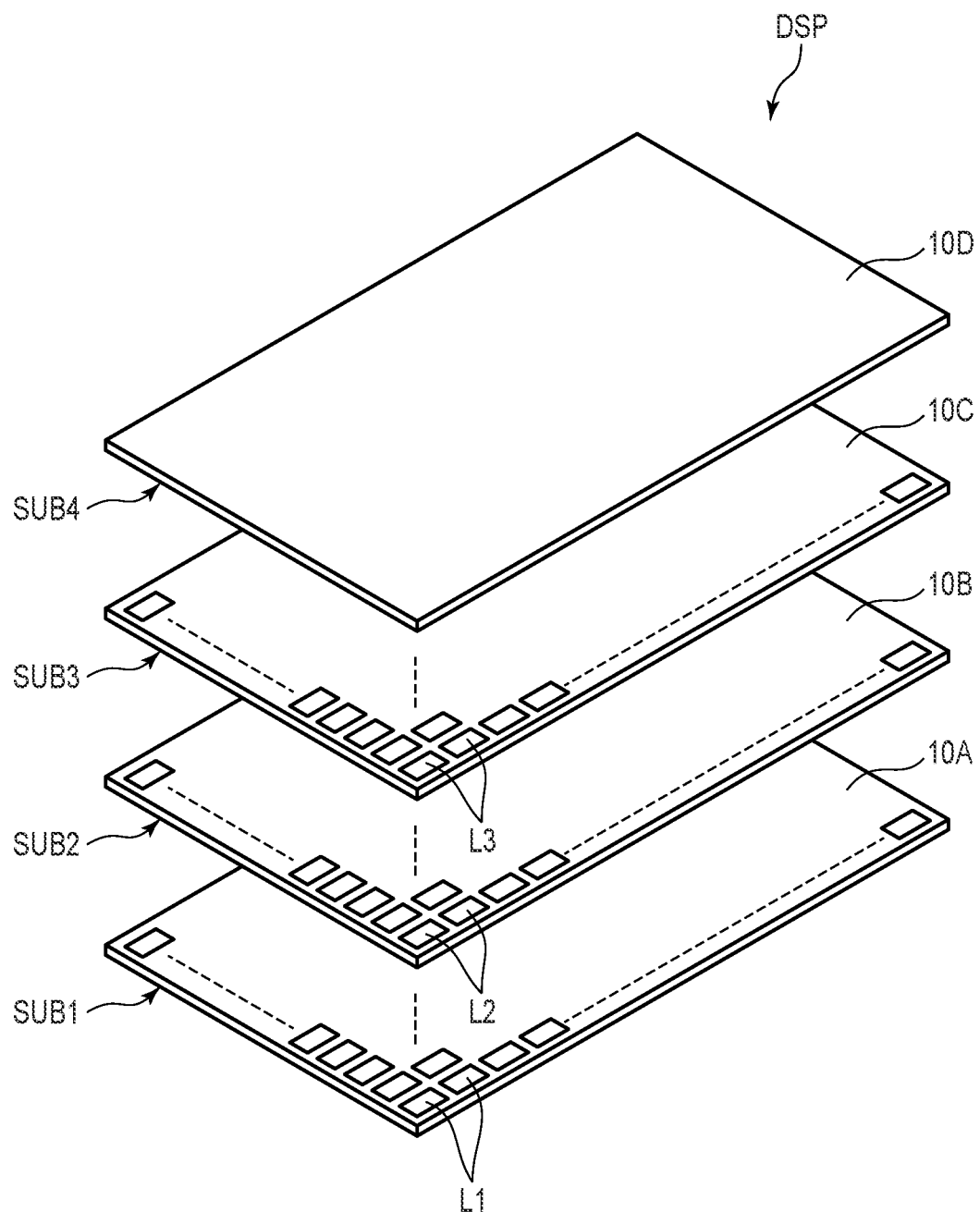
F I G. 1

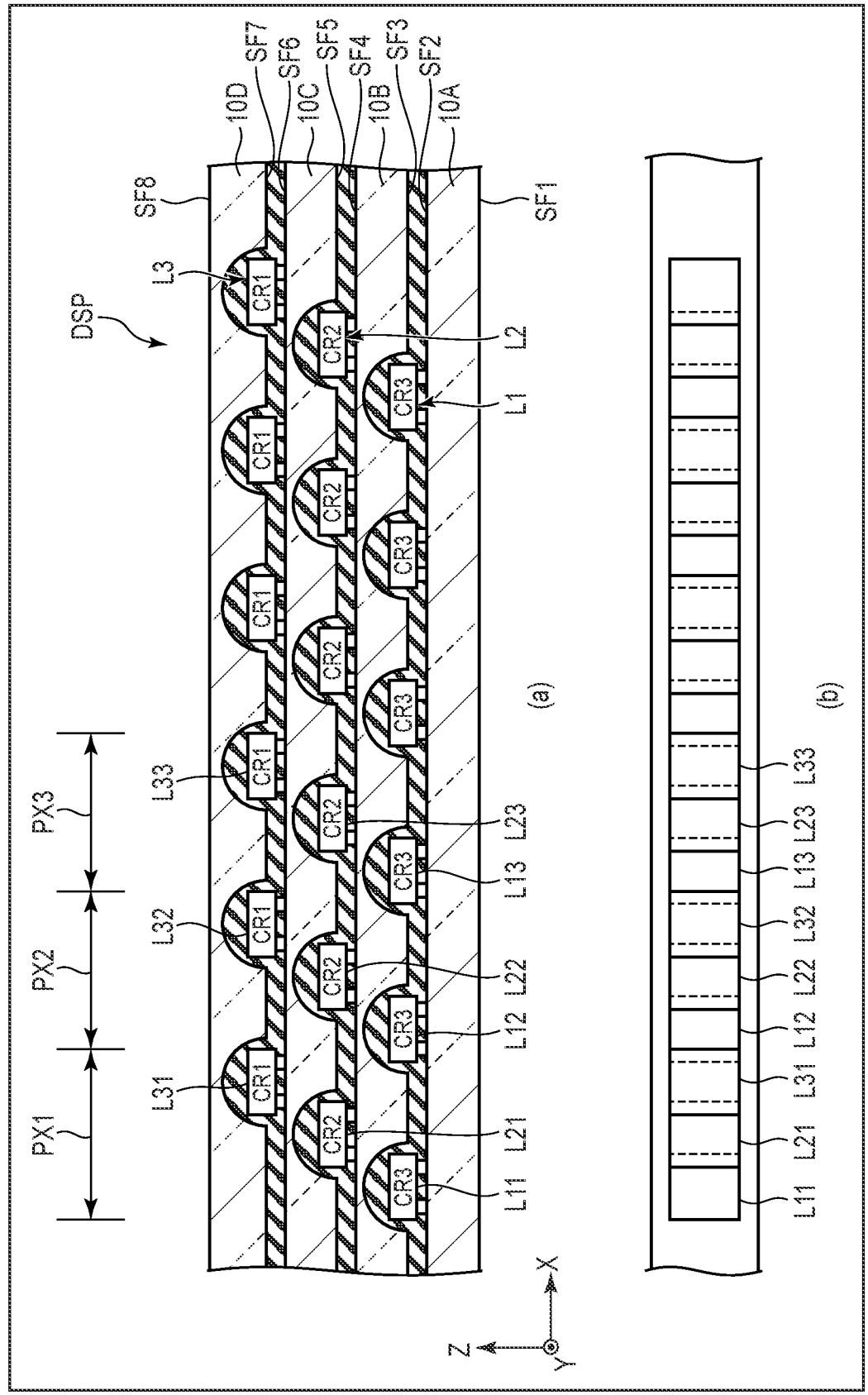
F I G. 6

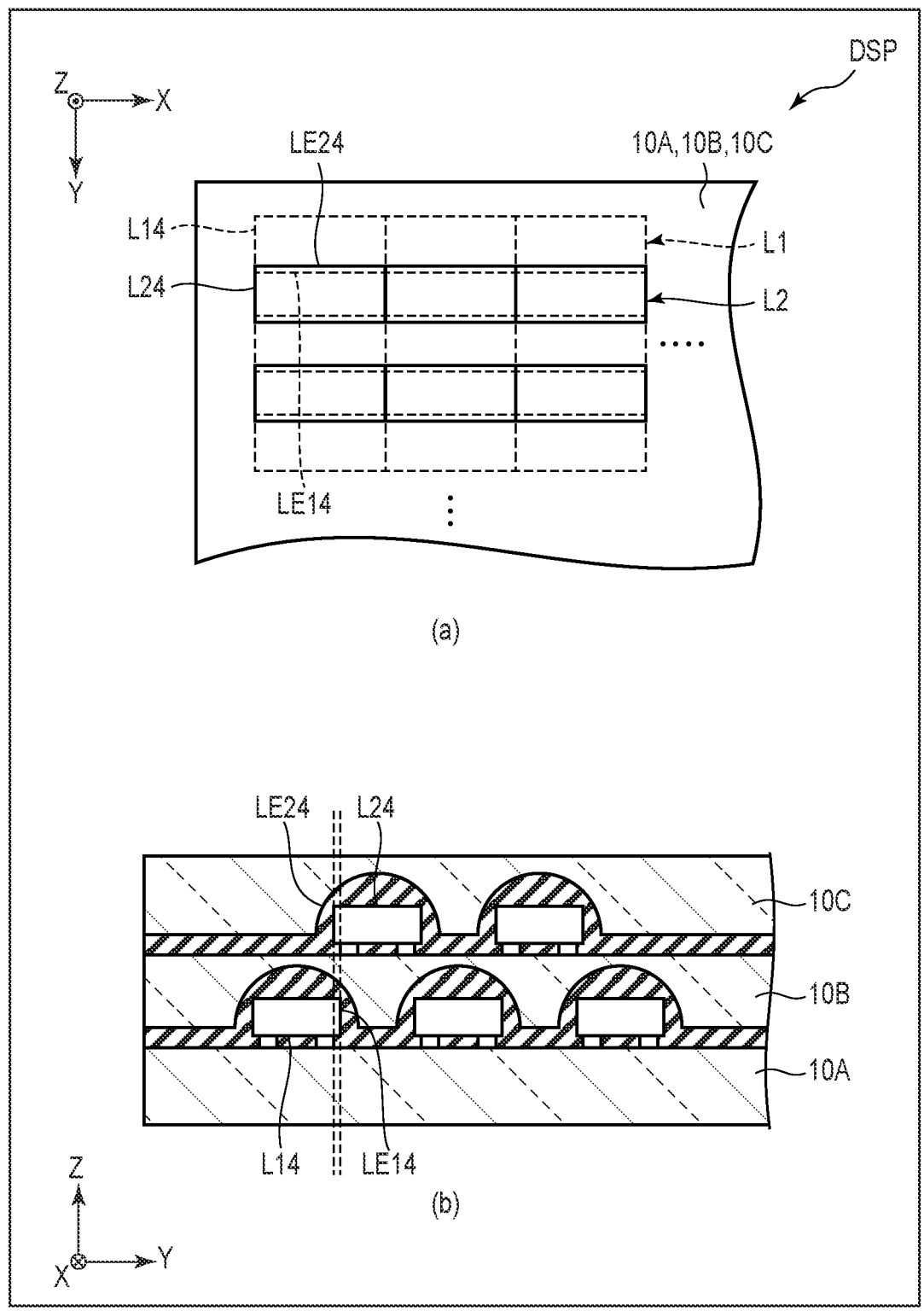
F I G. 8

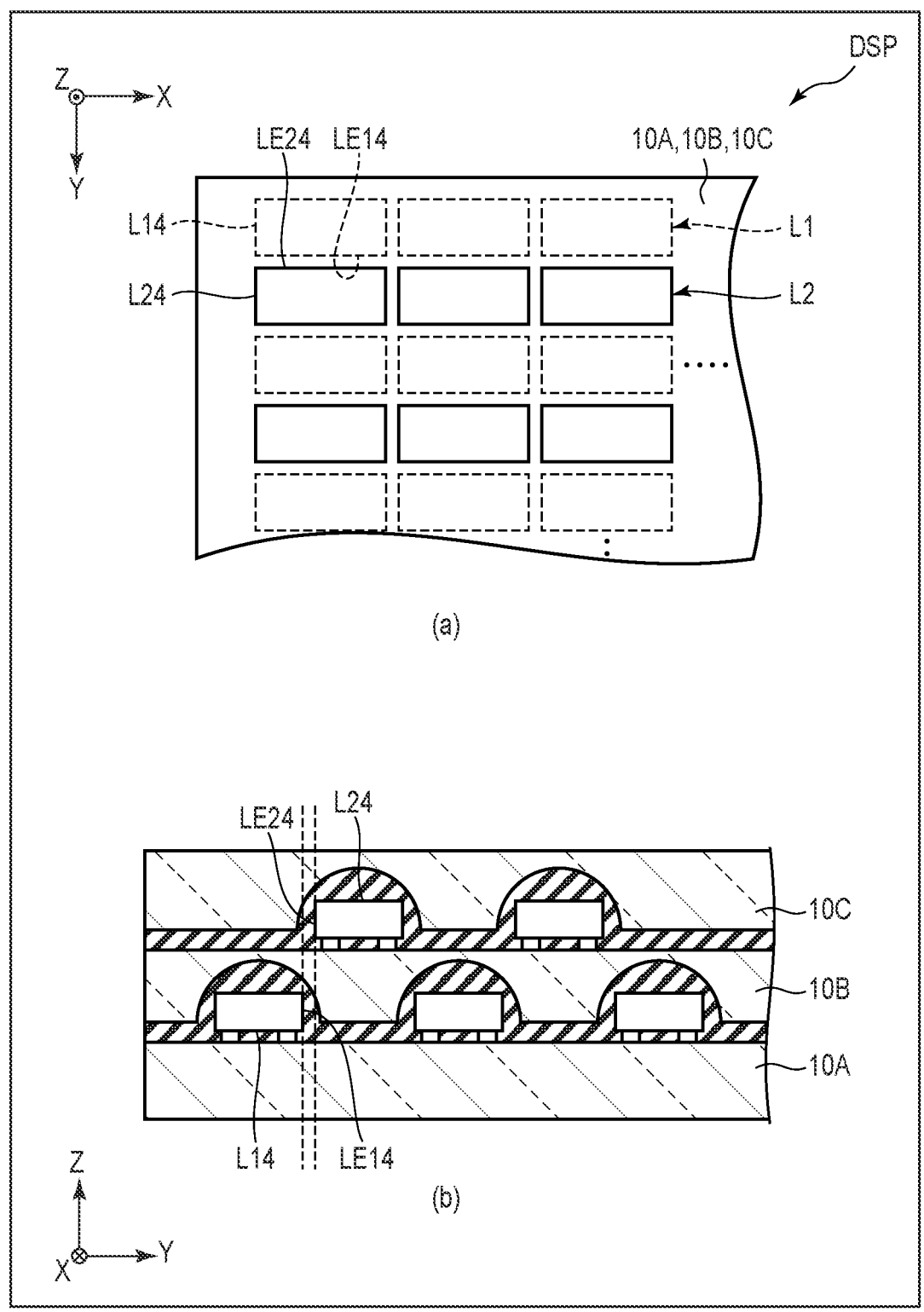
F I G. 9

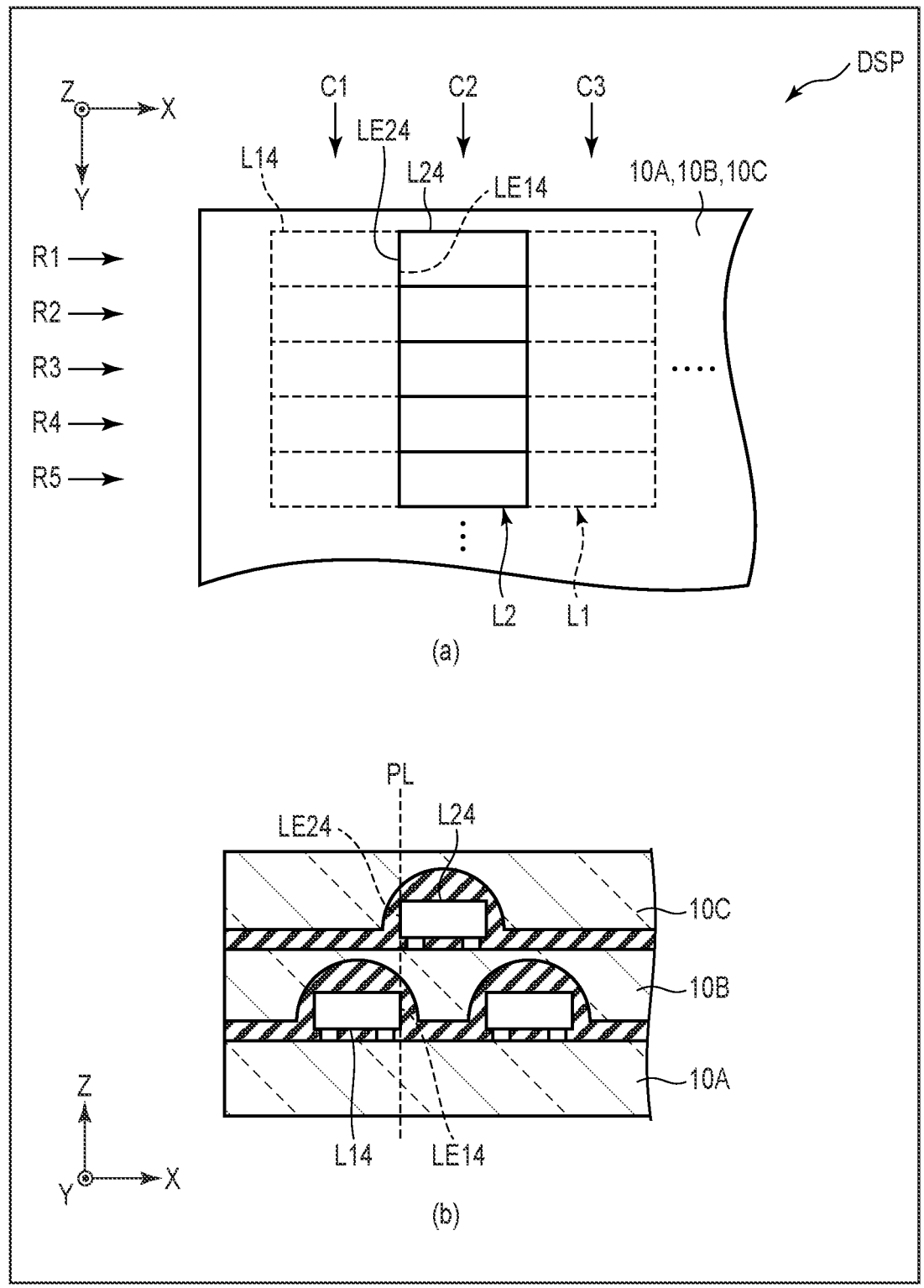
F I G. 10

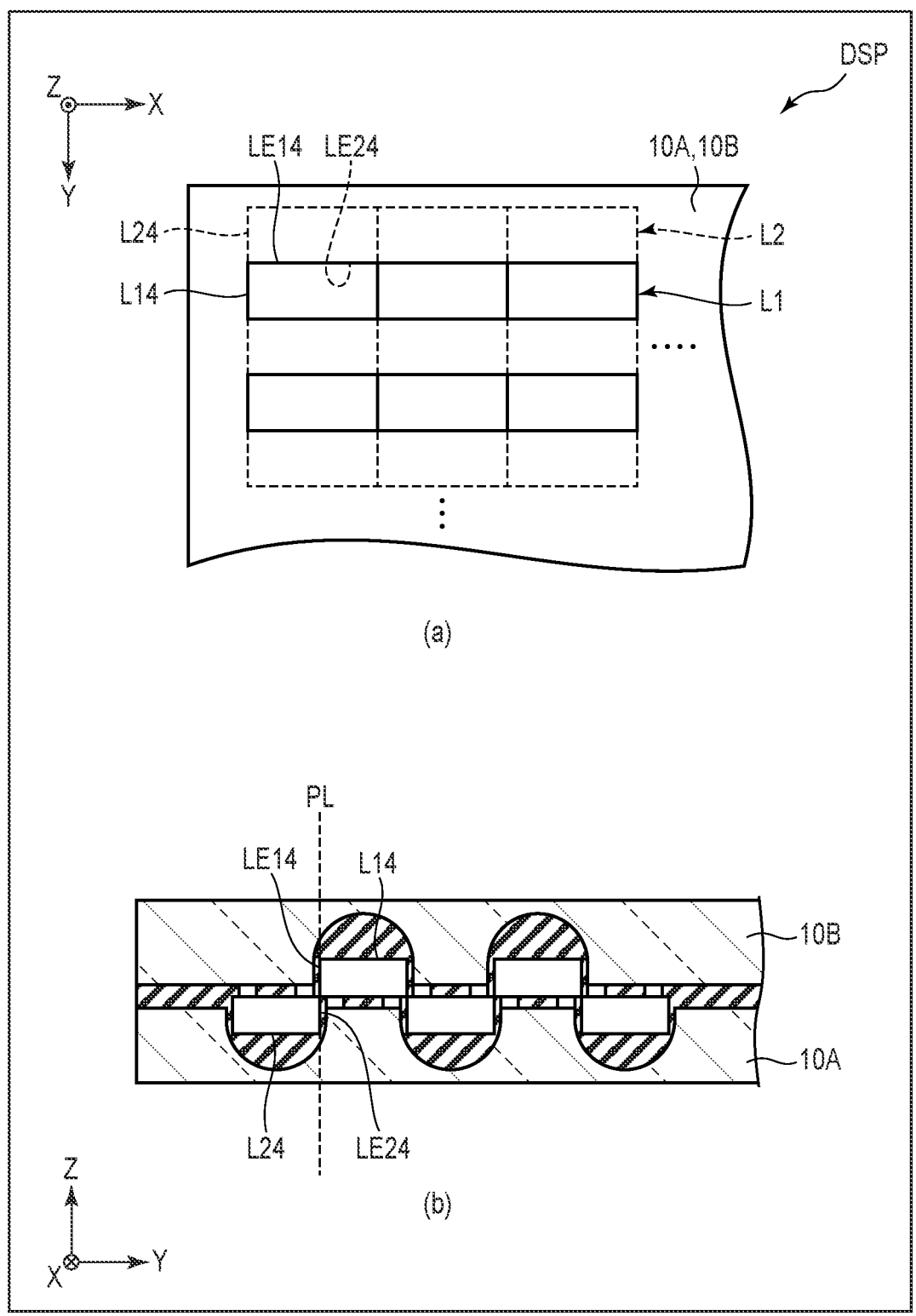
F I G. 20

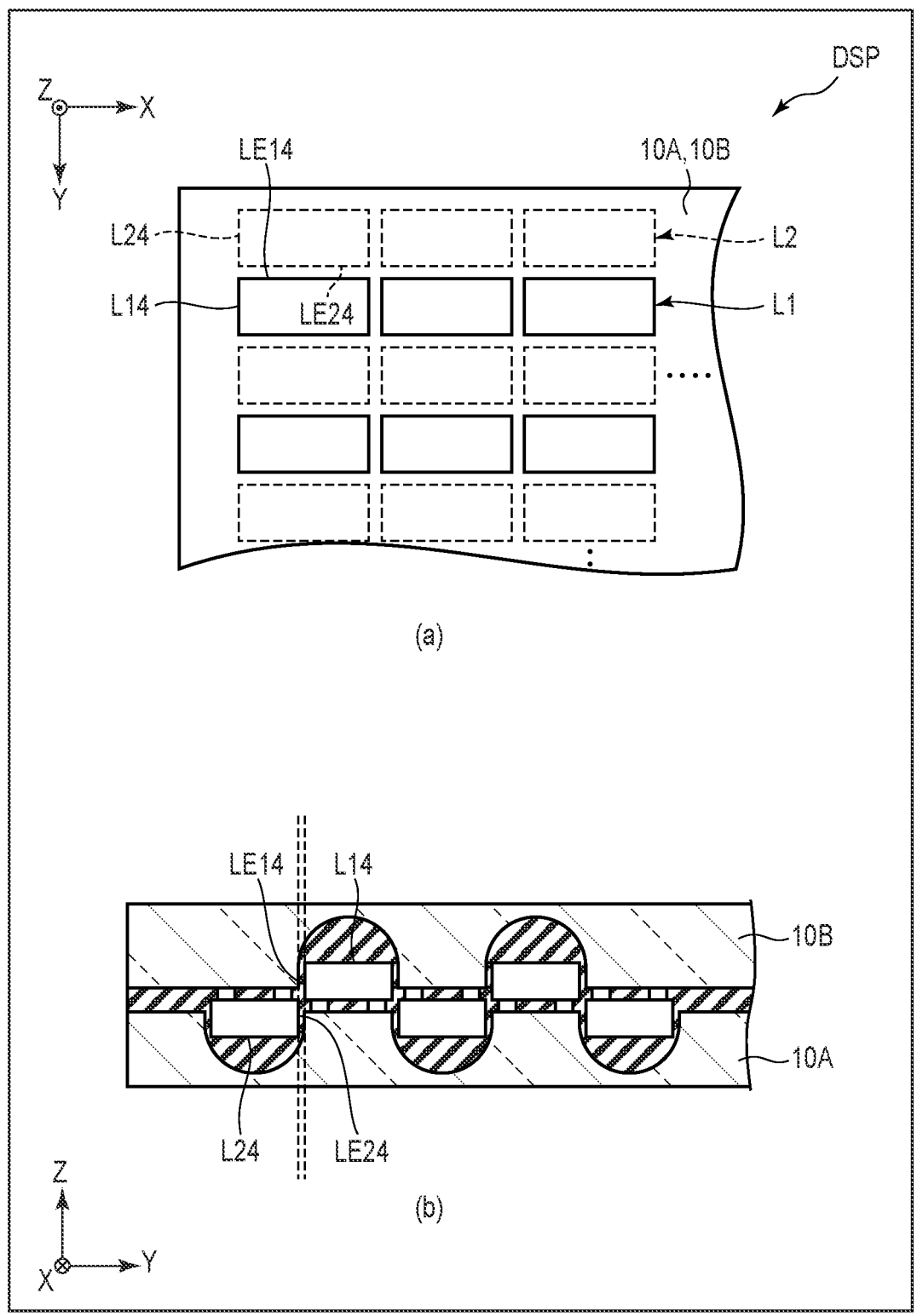
F I G. 22

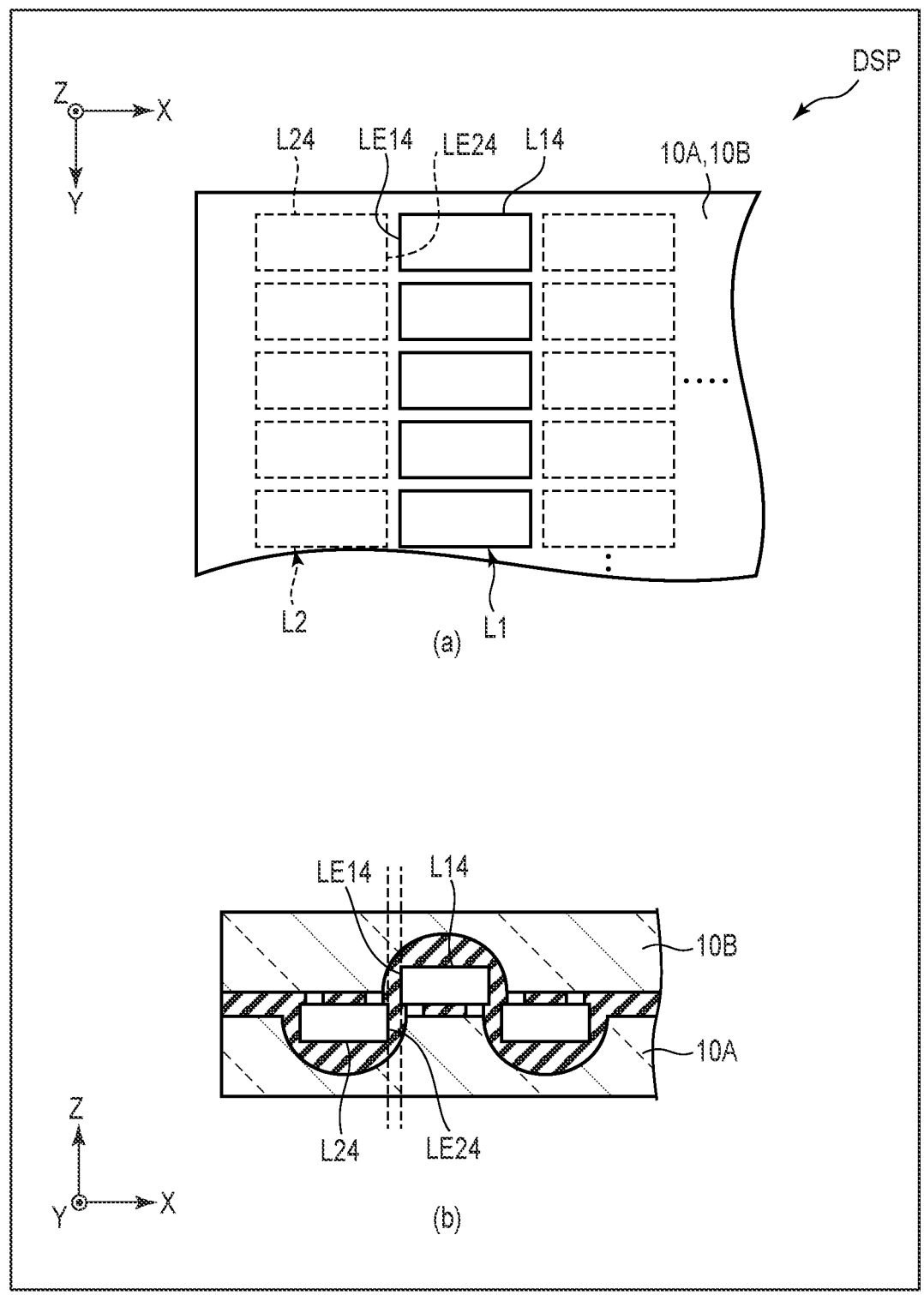
F I G. 25

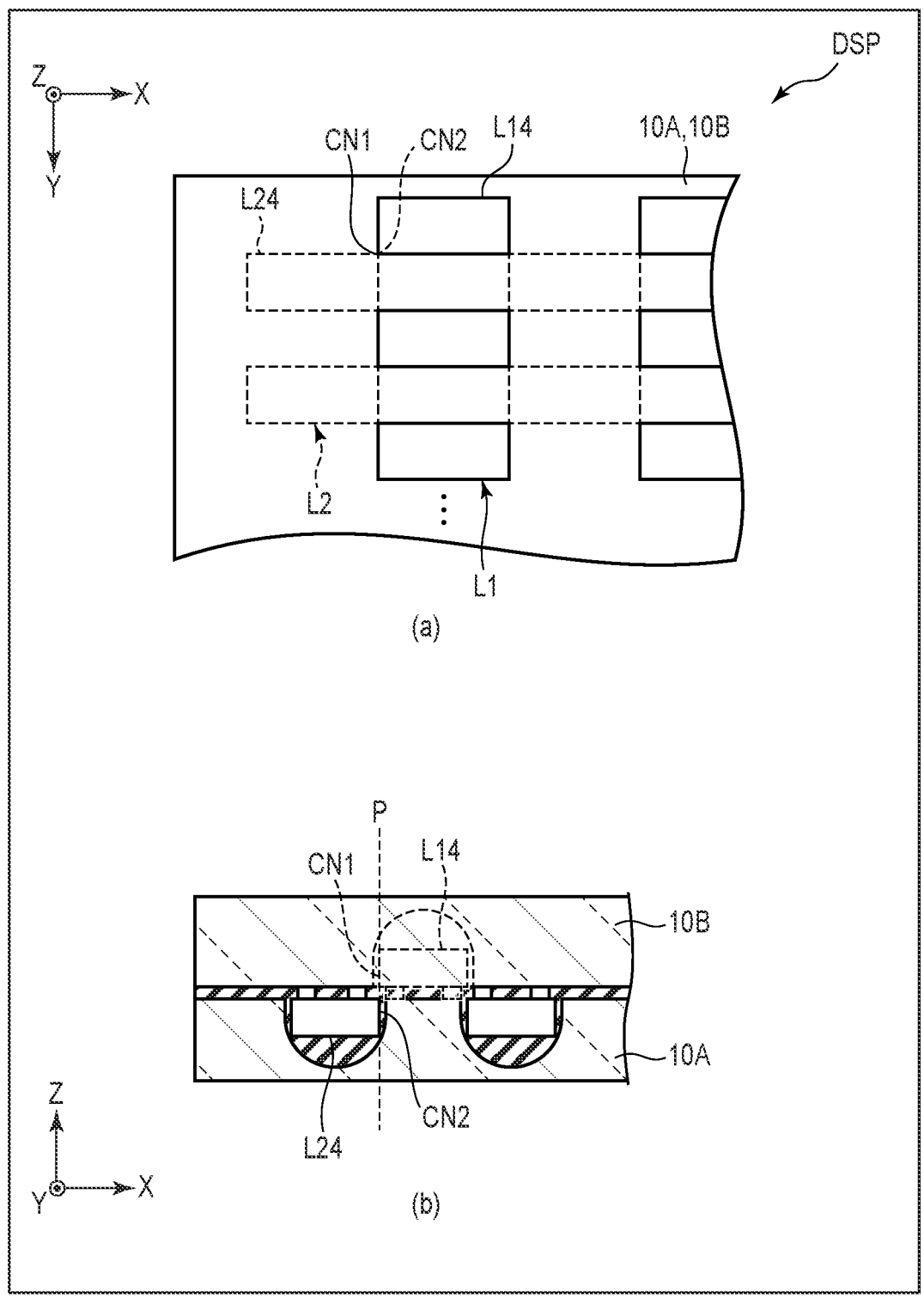
F I G. 26

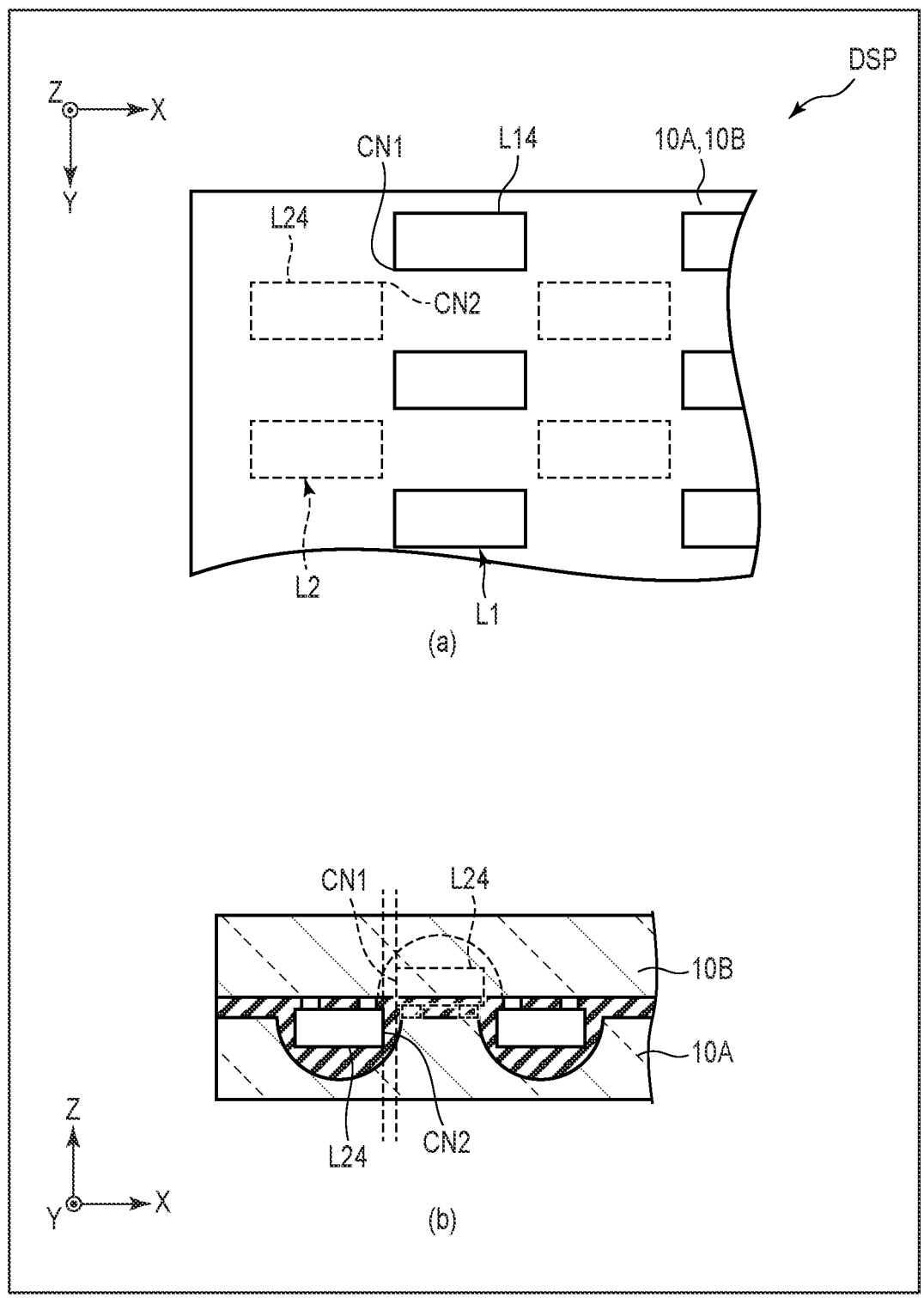
F I G. 28

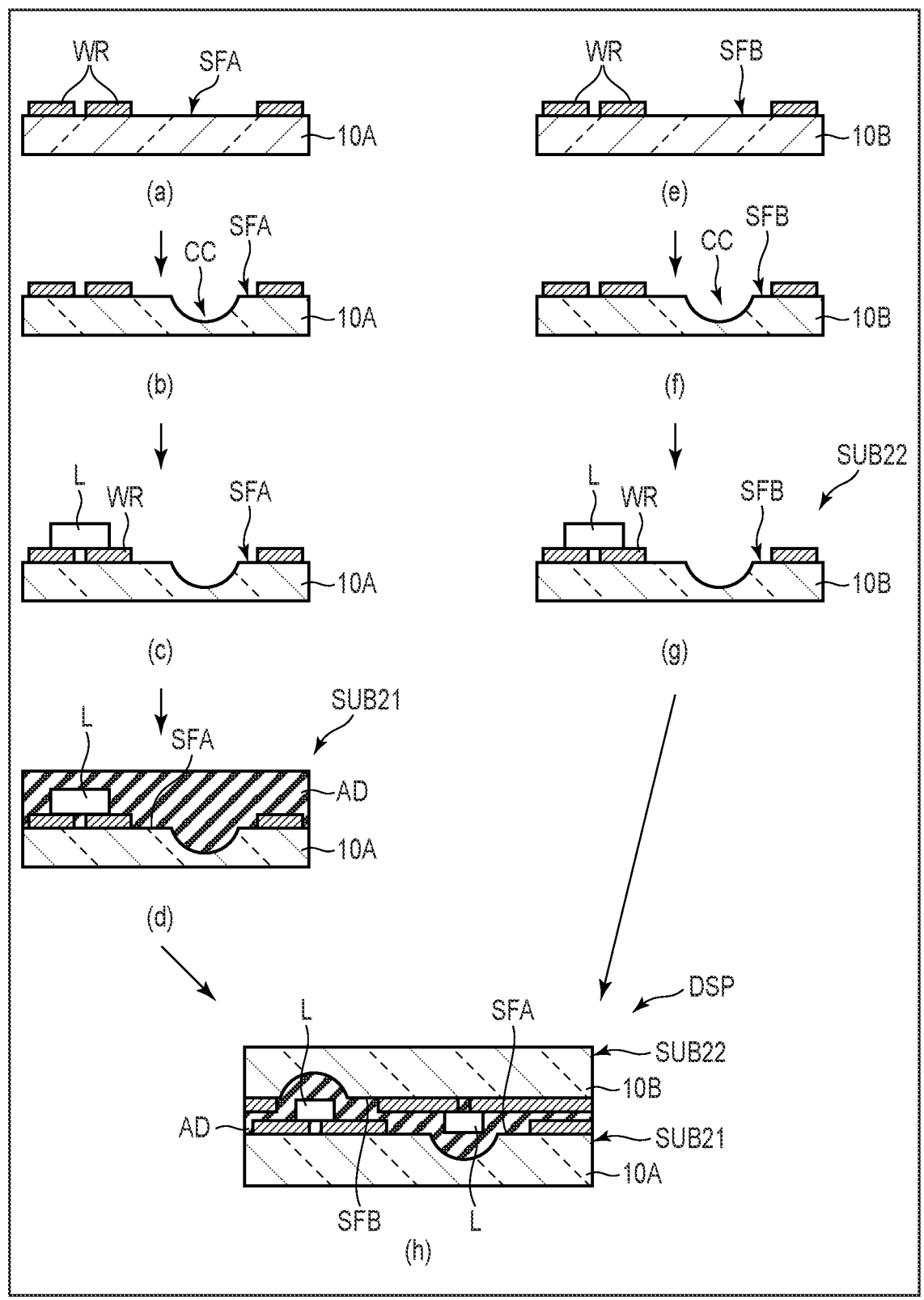
F I G. 29

DISPLAY DEVICE HAVING LIGHT EMITTING ELEMENT IN CONCAVE PORTION OF INSULATING SUBSTRATE

CROSS-REFERENCE TO RELATED APPLICATIONS

This application is a Continuation Application of PCT Application No. PCT/JP2021/000866, filed Jan. 13, 2021 and based upon and claiming the benefit of priority from Japanese Patent Application No. 2020-056411, filed Mar. 26, 2020, the entire contents of all of which are incorporated herein by reference.

FIELD

Embodiments described herein relate generally to a display device.

BACKGROUND

Light emitting diode (LED) display devices configured to display an images thereon by selectively turning on LED elements have been developed. LED display devices in which multiple flexible substrates on which LEDs are mounted are layered are known for three-dimensional (3D) display. Furthermore, as a next-generation display device, LED display devices in which micro LEDs or mini LEDs are implemented therein have been keenly developed. Such micro LEDs and mini LEDs are difficult to implement because of their size, and improvement of production yield is a key. Since thousands to tens of thousands micro LEDs and mini LEDs are implemented in such LED display devices, there may be parts where no light can be emitted because of non-implemented parts or dislocation.

BRIEF DESCRIPTION OF THE DRAWINGS

FIG. 1 is a perspective view which schematically illustrates a display device of a first embodiment in a disassembled manner.

FIG. 6 is a cross-sectional view illustrating a first variant of the first embodiment.

FIG. 8 is a diagram illustrating a third variant of the first embodiment.

FIG. 9 is a diagram illustrating a fourth variant of the first embodiment.

FIG. 10 is a diagram illustrating a fifth variant of the first embodiment.

FIG. 20 is a diagram illustrating a third variant of the second embodiment.

FIG. 22 is a diagram illustrating a fifth variant of the second embodiment.

FIG. 25 is a diagram illustrating an eighth variant of the second embodiment.

FIG. 26 is a diagram illustrating a ninth variant of the second embodiment.

FIG. 28 is a diagram illustrating an eleventh variant of the second embodiment.

FIG. 29 is a schematic diagram illustrating a manufacturing process of the display device of the second embodiment.

DETAILED DESCRIPTION

Figure 2:
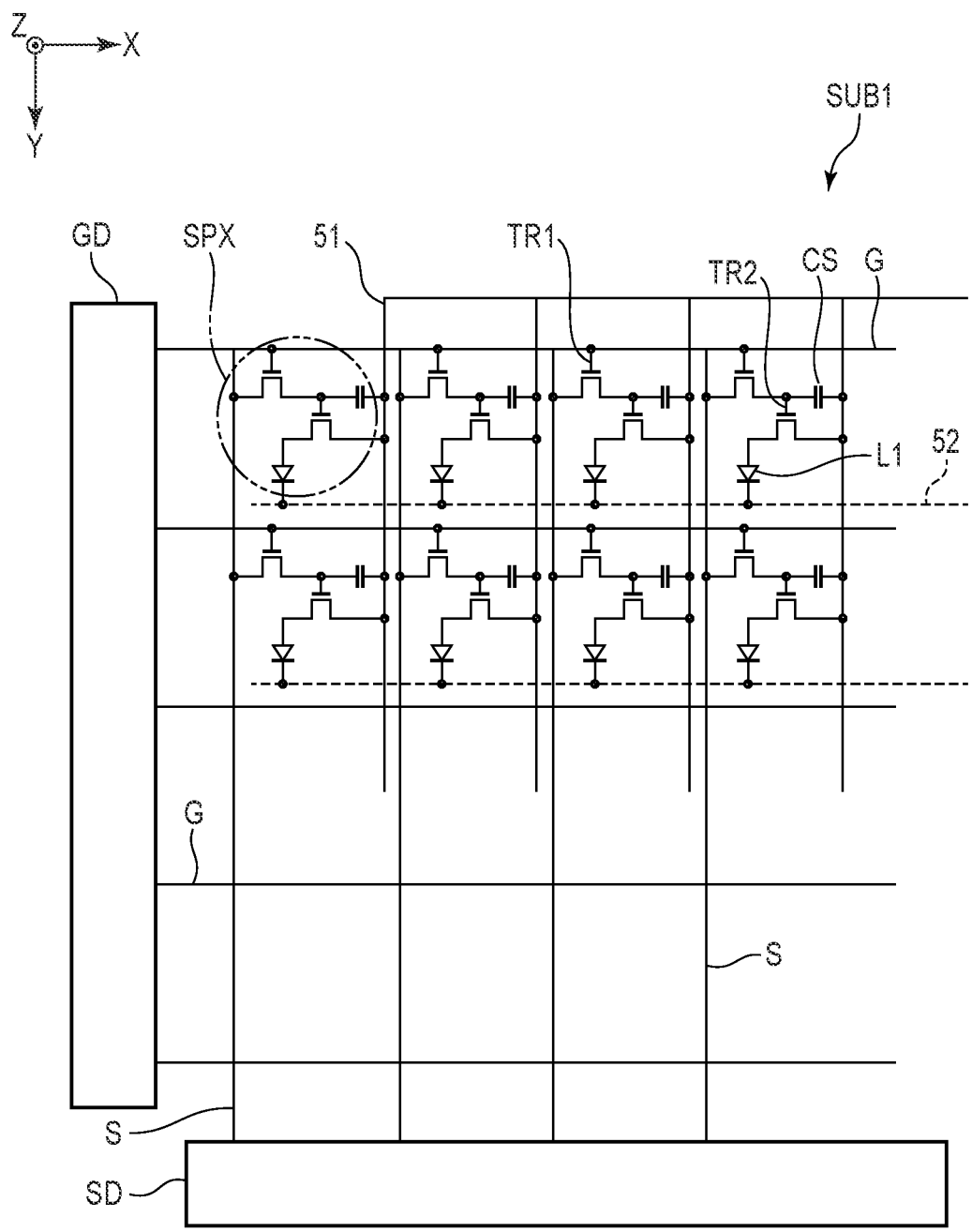
FIG. 2 is a diagram of an equivalent circuit of a first substrate of FIG. 1.

In general, according to one embodiment, a display device includes a first insulating substrate including a first surface and a second surface which is an opposite side to the first surface, a first light emitting element disposed on the second surface of the first insulating substrate, a second insulating substrate including a third surface opposed to the second surface and a fourth surface which is an opposite side to the third surface, and a second light emitting element disposed on the second insulating substrate, wherein the second insulating substrate includes a first concave portion in the third surface in a position opposed to the first light emitting element, and a second concave portion in a position opposed to the second light emitting element, at least a part of the first light emitting element is positioned inside the first concave portion, and at least a part of the second light emitting element is positioned inside the second concave portion.

According to another embodiment, a display device includes a first insulating substrate including a first surface and a second surface which is an opposite side to the first surface, a first light emitting element disposed on the second surface of the first insulating substrate, a second insulating substrate including a third surface opposed to the second surface and a fourth surface which is an opposite side to the third surface, a sixth light emitting element disposed on the second surface of the first insulating substrate, and a seventh light emitting element disposed on the third surface of the second insulating substrate and positioned between the first and sixth light emitting elements, wherein the second insulating substrate includes a first concave portion in the third surface in a position opposed to the first light emitting element, at least a part of the first light emitting element is positioned inside the first concave portion, at least a part of the sixth light emitting element is positioned inside the first concave portion, and the seventh light emitting element is positioned inside the first concave portion.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

First Embodiment

FIG. 1 is a perspective view which schematically illustrates a display device DSP of a first embodiment in a disassembled manner. The display device DSP of the present embodiment is a light emitting diode (LED) display device.

The drawings show a first direction X, a second direction Y and a third direction Z, which are orthogonal to each other, but they may intersect at an angle other than 90 degrees. In the following descriptions, a direction forwarding a tip of an arrow indicating the third direction Z is referred to as "upward" and a direction forwarding oppositely from the tip of the arrow is referred to as "downward". In addition, it is assumed that there is an observation position to observe a display device DSP on a tip side of an arrow in a third direction Z, and viewing from this observation position toward the X-Y plane defined by the first direction X and the second direction Y is referred to as a planar view.

The display device DSP includes a first substrate SUB1, second substrate SUB2, third substrate SUB3, and fourth substrate SUB4. The first substrate SUB1 includes an insulating substrate 10A and a plurality of light emitting elements L1 arranged in the insulating substrate 10A. The first substrate SUB1 is structured such that each of the light emitting elements L1 is mounted on the insulating substrate 10A. The second substrate SUB2 includes the insulating substrate 10B and a plurality of light emitting elements L2 arranged in the insulating substrate 10B. The third substrate SUB3 includes an insulating substrate 10C and a plurality of light emitting elements L3 arranged in the insulating substrate 10C. The fourth substrate SUB4 includes an insulating substrate 10D. The first substrate SUB1, second substrate SUB2, third substrate SUB3, and fourth substrate SUB4 are stacked in order from the bottom. The light emitting elements L1, L2, and L3 are arranged in a matrix in the first direction X and the second direction Y on the insulating substrates 10A, 10B, and 10C, respectively.

The insulating substrates 10A, 10B, 10C, and 10D are formed of transparent glass or resin, for example. Amongst the insulating substrates 10A, 10B, 10C, and 10D, the lowermost insulating substrate 10A is positioned in the opposite side to the display surface. The light emitting elements L1, L2, and L3 are, for example, LEDs such as mini LED or micro LED of approximately 100 μm in size, or LED of 100 μm or less in size.

FIG. 2 illustrates an equivalent circuit of the first substrate SUB1 of FIG. 1. FIG. 2 illustrates a typical circuit diagram using two types of thin-film transistors (switching transistor and drive transistor) to drive the light emitting element L.

The first substrate SUB1 includes a gate line G (or scanning line), source line S (or video signal line), first thin-film transistor TR1, second thin-film transistor TR2, light emitting element L1, capacitance element CS, first power line 51, second power line 52, gate driver GD, and source driver SD.

A plurality of gate lines G extend in the first direction X and are arranged at intervals in the second direction Y. A plurality of source lines S extend in the second direction Y and are arranged at intervals in the first direction X. An area defined by adjacent source lines S and adjacent gate lines G will be defined as subpixel SPX. Within the subpixel SPX, a first thin-film transistor TR1 (switching transistor), second thin-film transistor TR2 (drive transistor), light emitting element L1, and capacitance element CS are arranged, for example.

The second thin-film transistor TR2 is connected to the first power line 51. The first power line 51 is a power supply line which supplies current to the light emitting element L1. The light emitting element has an anode and a cathode. The first power line 51 is connected to one electrode of the light emitting element L1, for example, to the anode thereof, via the second thin-film transistor TR2. The second power line 52 is connected to the other electrode of the light emitting element L1, for example, to the cathode thereof. The second power line 52 is maintained at a constant potential, for example, ground potential.

The source electrode of the first thin-film transistor TR1 is electrically connected to the source line S. The gate electrode of the first thin-film transistor TR1 is electrically connected to the gate line G. The drain electrode of the first thin-film transistor TR1 is electrically connected to the gate electrode of the second thin-film transistor TR2. The drain electrode of the second thin-film transistor TR2 is electrically connected to the first power line 51. The source electrode of the second thin-film transistor TR2 is electrically connected to one electrode of the light emitting element L1, for example, to the anode thereof. The video signal from the source line S is input to the gate electrode of the second thin-film transistor TR2 via the first thin-film transistor TR1, and the second thin-film transistor TR2 drives the light emitting element L1. The capacitance element CS is placed between the drain electrode and the gate electrode of the second thin-film transistor TR2, in other words, between the first power line 51 and the gate electrode of the second thin-film transistor TR2. Since a constant potential is applied to the first power line 51, the potential of the gate electrode of the second thin-film transistor TR2 is maintained for a predetermined period of time by the capacitance element CS. The capacitance element CS may be disposed, for example, between the source electrode and the gate electrode of the second thin-film transistor TR2.

The gate line G is connected to the gate driver GD which includes a shift register. The source line S is connected to the source driver S which includes a shift register, video line, and analog switch. That is, the gate driver GD and the source driver SD function as a control unit which controls the light emitting element L1.

In each of the multiple subpixels SPX, when the first thin-film transistor TR1 is turned on upon receipt of the gate signal from the gate line G, the video signal from the source line S is input to the gate electrode of the second thin-film transistor TR2 via the first thin-film transistor TR1. Accordingly, through the channel layer of the second thin-film transistor TR2, current corresponding to the magnitude of the video signal is supplied to the light emitting element L1 from the first power line 51, and the light emitting element L1 emits light based on the supplied current.

Figure 3:
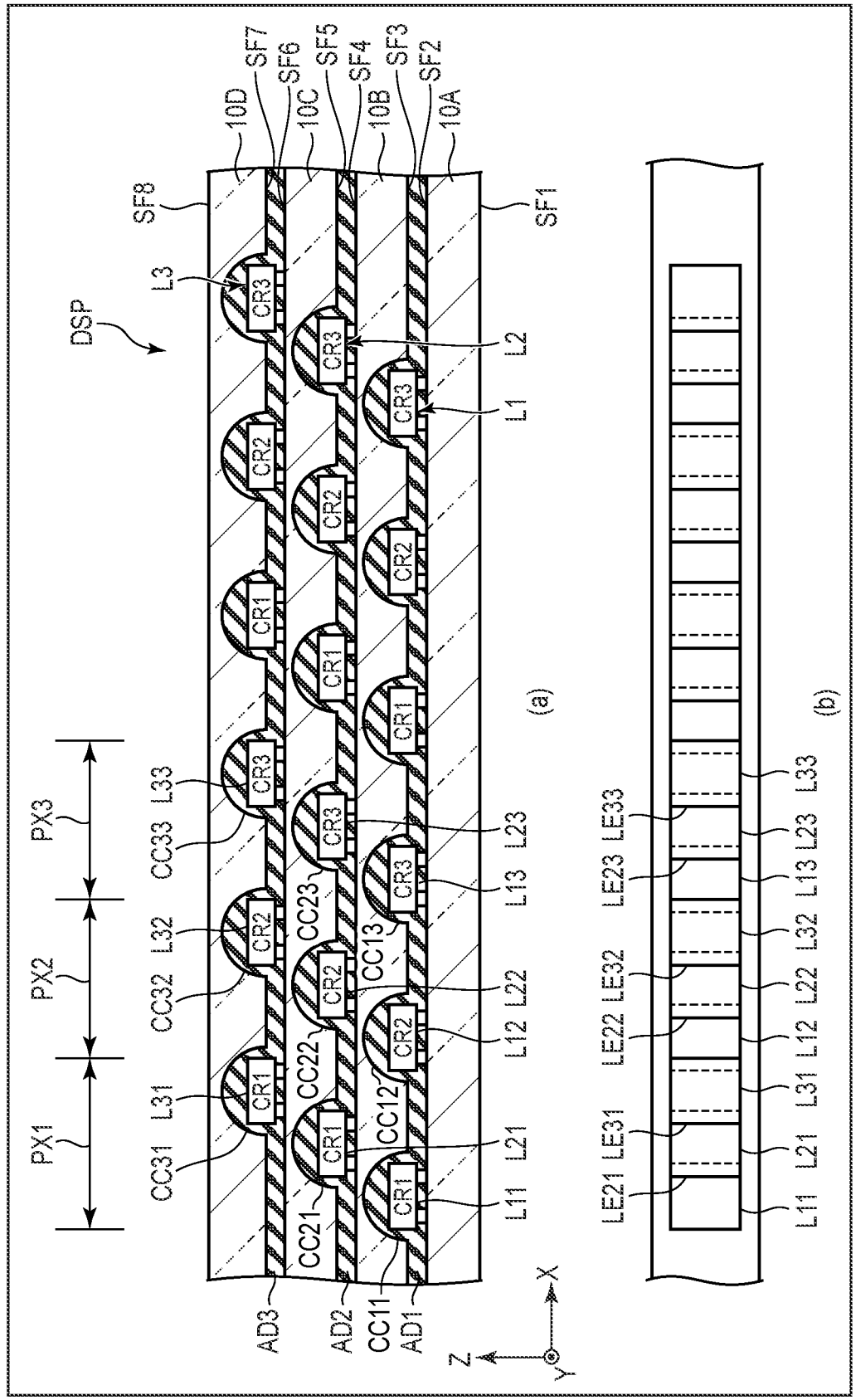
FIG. 3 is a diagram illustrating a part of the display device of FIG. 1.

FIG. 3 is a diagram illustrating a part of the display device DSP of FIG. 1. FIG. 3(a) is a cross-sectional view of the display device DSP of FIG. 1 in the first direction X. FIG. 3(b) is a plan view illustrating the positions of light emitting elements L1, L2, and L3 of FIG. 3(a).

The insulating substrate 10A includes a first surface SF1 and a second surface SF2 in the opposite side of the first surface SF1. The insulating substrate 10B includes a third surface SF3 opposed to the second surface SF2 and a fourth surface SF4 in the opposite side of the third surface SF3. The insulating substrate 10C includes a fifth surface SF4 opposed to the fourth surface SF4, and a sixth surface SF6 in the opposite side of the fifth surface SF5. The insulating substrate 10D includes a seventh face SF7 opposed to the sixth surface SF6 and an eighth surface SF8 in the opposite side of the seventh surface SF7. The eighth surface SF8 corresponds to a display surface on which an image is displayed.

Here, focusing on pixels PX1, PX2, and PX3, the detailed structure of the display device DSP will be explained.

The subpixel SPX of FIG. 2 includes one light emitting element L. In the example of FIG. 3, one pixel PX includes three subpixels SPX stacked therein. That is, in the example of FIG. 3, a pixel PX does not include multiple subpixels SPX disposed in the same insulating substrate. Thus, a pixel PX1 includes light emitting elements L11, L21, and L31. A pixel PX2 includes light emitting elements L12, L22, and L32. A pixel PX3 includes light emitting elements L13, L23, and L33.

The light emitting elements L11, L12, L13 are mounted on the second surface SF2. The light emitting elements L21, L22, and L23 are mounted on the fourth surface SF4. The light emitting elements L31, L32, and L33 are mounted on the sixth surface SF6. The light emitting elements L11, L12, and L13 correspond to the light emitting element L1 of FIG. 1. The light emitting elements L21, L22, and L23 correspond to the light emitting element L2 of FIG. 1. The light emitting elements L31, L32, and L33 correspond to the light emitting element L3 of FIG. 1. The light emitting element L12 is adjacent to the light emitting element L11. The light emitting element L13 is adjacent to the light emitting element L12. The light emitting element L22 is adjacent to the light emitting element L22. The light emitting element L23 is adjacent to the light emitting element L22. The light emitting element L32 is adjacent to the light emitting element L31. The light emitting element L33 is adjacent to the light emitting element L32.

The insulating substrate 10B includes a concave portion CC11 at a position opposed to the light emitting element L11, concave portion CC12 at a position opposed to the light emitting element L12, and concave portion CC13 at a position opposed to the light emitting element L13. The concave portions CC11, CC12, and CC13 are formed on the third surface SF3. At least a part of the light emitting element L11 is positioned inside the concave portion CC11, at least a part of the light emitting element L12 is positioned inside the concave portion CC12, and at least a part of the light emitting element L13 is positioned inside the concave portion CC13.

The insulating substrate 10C includes a concave portion CC21 at a position opposed to the light emitting element L21, concave portion CC22 at a position opposed to the light emitting element L22, and concave portion CC23 at a position opposed to the light emitting element L23. The concave portions CC21, CC22, and CC23 are formed on the fifth surface SF5. At least a part of the light emitting element L21 is positioned inside the concave portion CC21, at least a part of the light emitting element L22 is positioned inside the concave portion CC22, and at least a part of the light emitting element L23 is positioned inside the concave portion CC23.

The insulating substrate 10D includes a concave portion CC31 at a position opposed to the light emitting element L31, concave portion CC32 at a position opposed to the light emitting element L32, and concave portion CC33 at a position opposed to the light emitting element L33. The concave portions CC31, CC32, and CC33 are formed on the seventh surface SF7. At least a part of the light emitting element L31 is positioned inside the concave portion CC31, at least a part of the light emitting element L32 is positioned inside the concave portion CC32, and at least a part of the light emitting element L33 is positioned inside the concave portion CC33.

The display device DSP includes an adhesive layer AD1 which adheres the second surface SF2 and the third surface SF3, adhesive layer AD2 which adheres the fourth surface SF4 and the fifth surface SF5, and adhesive layer AD3 which adheres the sixth surface SF6 and the seventh surface SF7. The adhesive layer AD1 is positioned inside the concave portions CC11, CC12, and CC13 and contacting the light emitting elements L11, L12, and L13. The adhesive layer AD2 is positioned in the concave portions CC21, CC22, and CC23, and contacting the light emitting elements L21, L22, and L23. The adhesive layer AD3 is positioned inside the concave portions CC31, CC32, and CC33 and contacting the light emitting elements L31, L32, and L33. The adhesive layers AD1, AD2, and AD3 are formed of, for example, optical clear adhesive (OCA) or optical clear resin (OCR). Since there is no air layer between the insulating substrates 10A and 10B, or between the insulating substrates 10B and 10C, or between the insulating substrates 10C and 10D, the attenuation of light intensity can be suppressed.

In the example illustrated, the light emitting elements L11, L21, and L31 of pixel PX1 emit a first color CR1, the light emitting elements L12, L22, and L32 of pixel PX2 emit a second color CR2, and the light emitting elements L13, L23, and L33 emit a third color CR3. That is, the pixel PX1 is a pixel to display the first color CR1, the pixel PX2 is a pixel to display the second color CR2, and the pixel PX3 is a pixel to display the third color CR3. The first color CR1, second color CR2, and third color CR3 are different colors. For example, the first color CR1, second color CR2, and third color CR3 may be red, blue, and green.

As in FIG. 3(b), the light emitting elements L11, L21, and L31 are adjacent to each other in this order in a plan view. The light emitting elements L12, L22, and L32 are adjacent to each other in this order in a plan view. The light emitting elements L13, L23, and L33 are adjacent to each other in this order in a plan view. In the pixel PX1, an element edge portion LE31 of the light emitting element L31 overlaps with the light emitting element L21 in a plan view, and an element edge portion LE21 of the light emitting element L21 overlaps with the light emitting element L11 in a plan view. In the pixel PX2, an element edge portion LE32 of the light emitting element L32 overlaps with the light emitting element L22 in a plan view, and an element edge portion LE22 of the light emitting element L22 overlaps with the light emitting element L12 in a plan view. In the pixel PX3, an element edge portion LE33 of the light emitting element L33 overlaps with the light emitting element L23 in a plan view, and an element edge portion LE23 of the light emitting element L23 overlaps with the light emitting element L13 in a plan view.

As in FIG. 2, a gate line G and a source line S are located between adjacent light emitting elements L in each insulating substrate, and thus, the gate line G and the source line S may overlap with the light emitting element L of other layers. In that case, for example, the gate line G and the source line S may be formed of a transparent conductive material such as indium tin oxide (ITO) or indium zinc oxide (IZO). Note that, even if the gate line G and the source line S are formed of metal wiring as in the case of publically-known organic EL display devices and liquid crystal display devices, the display is not particularly interfered thereby by appropriately adjusting the width of the metal wiring.

According to the present embodiment, insulating substrates on which a plurality of light emitting elements L are mounted is stacked. That is, in one pixel, multiple light emitting elements L to emit the same color are stacked. In LED display devices using micro-LEDs and mini-LEDs, the size of LEDs is small and the number of LEDs mounted is large. This may cause misalignment of LED mounting positions and defects in LED light emission. As a result, there is a concern that non-luminescent pixels may occur in the LED display device. In the structure of the present embodiment, multiple light emitting elements L of the same color are stacked in a single pixel, and thus, even if a non-illuminated light emitting element occurs on a single substrate, that is, even if a non-luminescent area is created, the light emission can be compensated by the light emitting elements L in other substrates stacked. Furthermore, since each insulating substrate can display a different image, even fast moving images can be displayed without delay. That is, compared to LED display devices in which light emitting elements L are placed on a single insulating substrate, the structure of the present embodiment can achieve a faster response time. Furthermore, each of the insulating substrates 10B, 10C, 10D has a concave portion CC in the position opposed to the light emitting element L. By accommodating the light emitting element L in the concave portion CC, it is possible to reduce the thickness of the display device DSP even when multiple insulating substrates are stacked.

In the example illustrated, three layers of light emitting elements L are stacked, but it is not limited to this example; two layers may be stacked, or four or more layers may be stacked.

Figure 4:
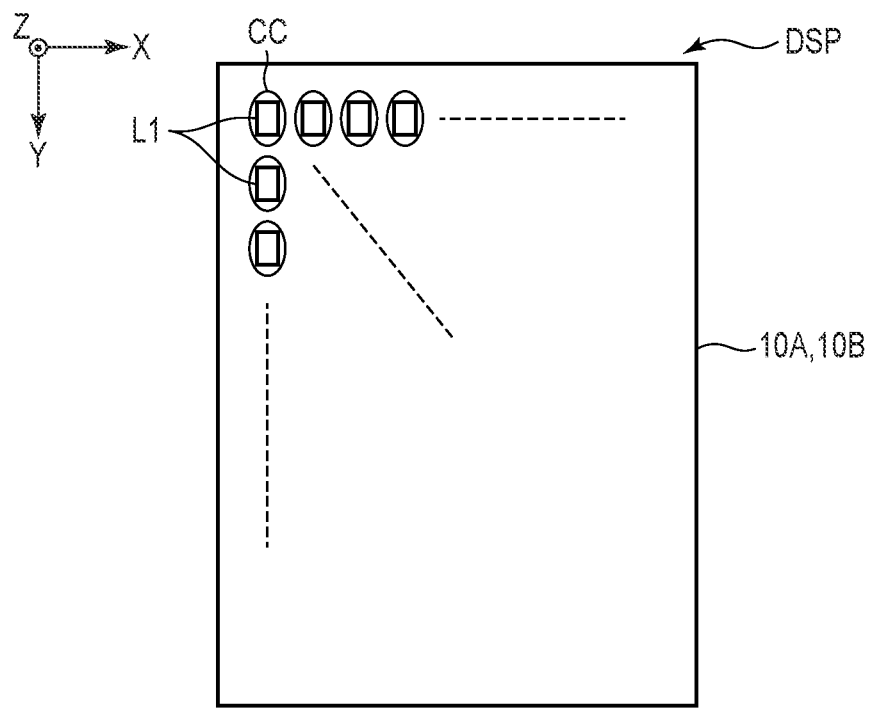
FIG. 4 is a plan view illustrating a positional relationship between a light emitting element and a concave portion.

FIG. 4 is a plan view illustrating a positional relationship between the light emitting element L and the concave portion CC. FIG. 4 illustrates, as an example, a positional relationship between the light emitting element L1 mounted on the insulating substrate 10A and the concave portion CC formed in the insulating substrate 10B.

The concave portion CC is elliptical in a plan view. In the example illustrated, one concave portion CC accommodates one light emitting element L1. Note that, the positional relationship between the light emitting element L2 mounted on the insulating substrate 10B and the concave portion CC formed in the insulating substrate 10C, and the positional relationship between the light emitting element L3 mounted on the insulating substrate 10C and the concave portion CC formed in the insulating substrate 10D are the same as with the structure of FIG. 4.

Figure 5:
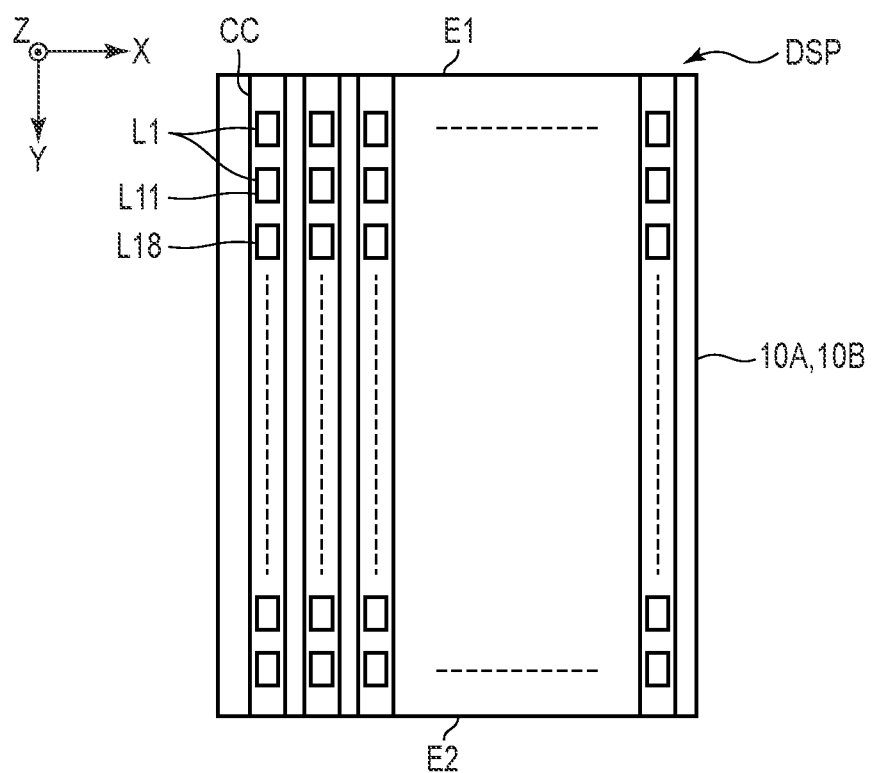
FIG. 5 is a plan view illustrating a positional relationship between the light emitting element and the concave portion.

FIG. 5 is a plan view illustrating the positional relationship between the light emitting element L and the concave portion CC. The structure of FIG. 5 has a different shape of concave portion CC compared to the structure of FIG. 4.

The insulating substrate 10B includes a first substrate end portion E1 and a second substrate end portion E2 which is in the opposite side of the first substrate end portion E1. The concave portion CC extends from the first substrate end portion E1 to the second substrate end portion E2. One concave portion CC accommodates at least the light emitting element L11 and the light emitting element L18 adjacent to the light emitting element L11. That is, one concave portion CC may accommodate multiple light emitting elements L1. In the example illustrated, the concave portion CC extends in the second direction Y, and thus, the multiple emitting elements L1 aligned in the second direction Y are accommodated. Note that, the positional relationship between the light emitting element L2 mounted on the insulating substrate 10B and the concave portion CC formed in the insulating substrate 10C, and the positional relationship between the light emitting element L3 mounted on the insulating substrate 10C and the concave portion CC formed in the insulating substrate 10D are the same as with the structure of FIG. 5.

FIG. 6 is a cross-sectional view of a first variant of the first embodiment. FIG. 6(a) is a cross-sectional view of the display device DSP of FIG. 1, taken along the first direction X. FIG. 6(b) is a plan view illustrating positions of light emitting elements L1, L2, and L3 of FIG. 6(a). The structure of FIG. 6 has different colors emitted by the light emitting elements L1, L2, and L3 compared to the structure of FIG. 3.

A plurality of light emitting elements L1 mounted on an insulating substrate 10A emit a first color CR1. That is, light emitting elements L11, L12, and L3 emit the first color CR1. A plurality of light emitting elements L2 mounted on an insulating substrate 10B emit a second color CR2. That is, light emitting elements L21, L22, and L23 emit the second color CR2. A plurality of light emitting elements L3 mounted on an insulating substrate 10C emit a third color CR3. That is, light emitting elements L31, L32, and L33 emit the third color CR3.

According to the first variant, the light emitting elements L of the same emitting color are mounted on one insulating substrate. Therefore, the mounting of light emitting elements L can be simplified as compared to the case where multiple colors of light emitting elements L are mounted on a single insulating substrate. Furthermore, the placement density of light emitting elements L on each insulating substrate may be controlled. For example, light emitting elements of a color with low luminosity may be placed in a larger density. Note that, as in FIG. 6(b), edges of light emitting elements L overlap adjacent light emitting elements L in a plan view; however, the adjacent light emitting elements may not have to overlap each other.

Figure 7:
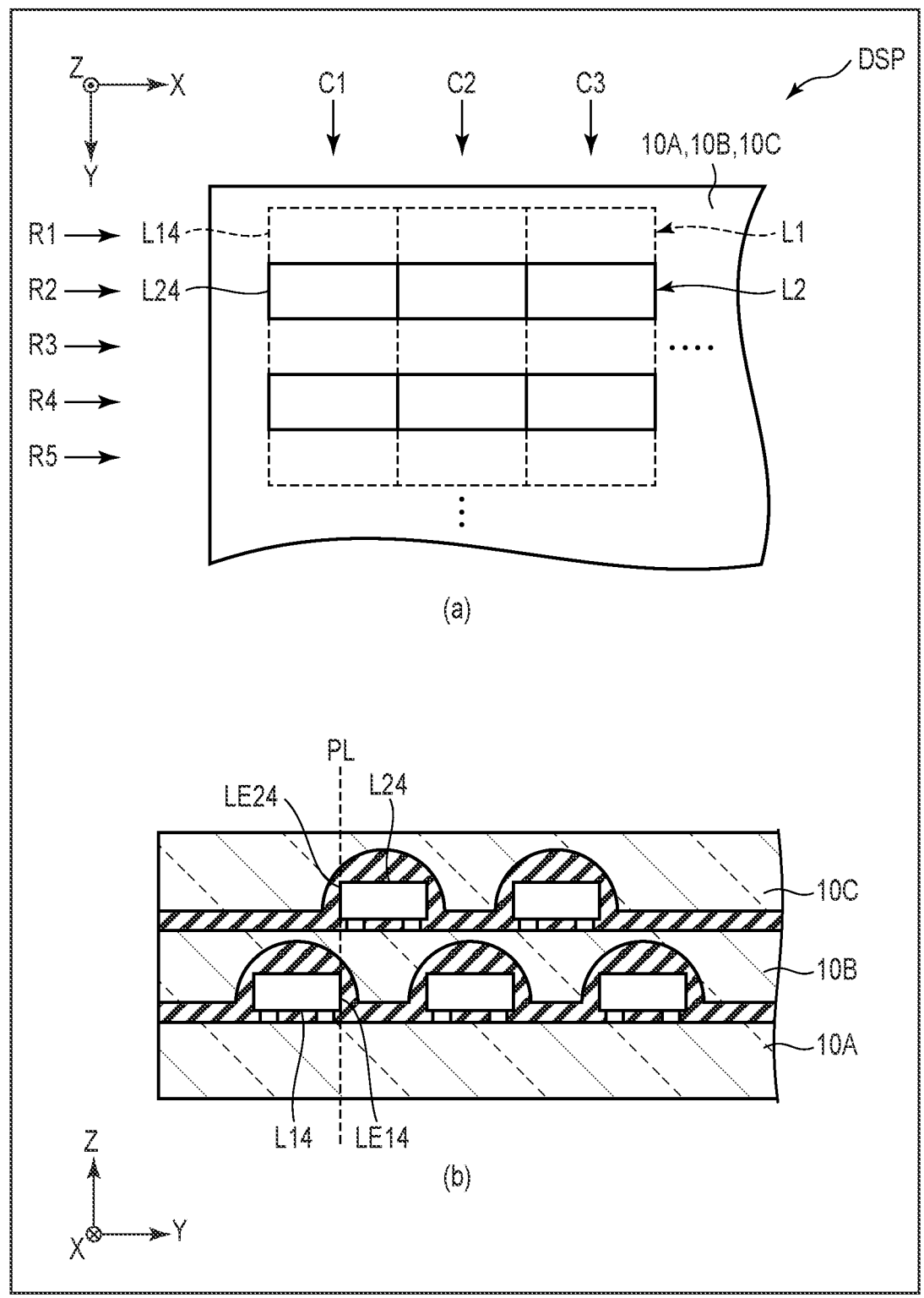
FIG. 7 is a diagram illustrating a second variant of the first embodiment.

FIG. 7 illustrates a second variant of the first embodiment. FIG. 7(a) is a plan view illustrating a part of the display device DSP, and FIG. 7(b) is a cross-sectional view of the display device DSP of FIG. 7(a), taken along the second direction Y.

In FIG. 7(a), the light emitting element L1 mounted on the insulating substrate 10A is shown in a dotted line, and light emitting element L2 mounted on the insulating substrate 10B is shown in a solid line. In rows R1, R3, and R5, the light emitting elements L are aligned in the first direction X. In rows R2 and R4, the light emitting elements L2 are aligned in the first direction X. In columns C1, C2, and C3, the light emitting elements L1 and L2 are alternately aligned in the second direction Y. Here, focusing on the light emitting element L14 which is one of the light emitting elements L1 and the light emitting element L24 which is one of the light emitting elements L2, a positional relationship therebetween will be explained. The light emitting elements L14 and L24 are adjacent to each other in the second direction Y in a plan view. As in FIG. 7(b), the light emitting element L14 includes an element edge portion LE14 positioned in the light emitting element L24 side. The light emitting element L24 includes an element edge portion LE24 positioned in the light emitting element L14 side. The element edge portions LE14 and LE24 are placed on the same plane PL.

For example, light emitting elements L1 and L2 in column C1 are the first color CR1, light emitting elements L1 and L2 in column C2 are the second color CR2, and light emitting elements L1 and L2 in column C3 are the third color CR3. Or, the first color CR1, second color CR2, and third color CR3 may be aligned along the first direction X or the second direction Y in this order. Or, the first color CR1, second color CR2, and third color CR3 may be arranged randomly.

Note that, in the example illustrated, two layers of light emitting elements L are stacked; however, three or more layers may be stacked therein.

FIG. 8 illustrates a third variant of the first embodiment. FIG. 8(a) is a plan view illustrating a part of the display device DSP, and FIG. 8(b) is a cross-sectional view of the display device DSP, taken along the second direction Y. The structure of FIG. 8 indicates that the edge of the light emitting element L1 overlaps the light emitting element L2, and in this respect, it is different from the structure of FIG. 7. The element edge portion LE14 overlaps the light emitting element L24. Furthermore, the element edge portion LE24 overlaps the light emitting element L14.

FIG. 9 illustrates a fourth variant of the first embodiment. FIG. 9(a) is a plan view illustrating a part of the display device DSP, and FIG. 9(b) is a cross-sectional view of the display device DSP, taken along the second direction Y. The structure of FIG. 9 indicates that the edge of the light emitting element L1 is apart from the edge of the light emitting element L2, and in this respect, it is different from the structure of FIG. 7. The element edge portion E14 and the element edge portion E24 are apart from each other in a plan view.

FIG. 10 illustrates a fifth variant of the first embodiment. FIG. 10(a) is a plan view illustrating a part of the display device DSP, and FIG. 10(b) is a cross-sectional view of the display device DSP of FIG. 10(a), taken along the first direction X.

As in FIG. 10(a), in rows R1 to R5, the light emitting elements L1 and L2 are aligned alternately in the first direction X. In columns C1 and C3, the light emitting elements L1 are aligned in the second direction Y. In column C2, the light emitting elements L2 are aligned in the second direction Y. The light emitting elements L14 and L24 are adjacent to each other in the first direction X in a plan view. As in FIG. 7(b), the light emitting element L14 includes an element edge portion LE14 positioned in the light emitting element L24 side. The light emitting element L24 includes an element edge portion LE24 positioned in the light emitting element L14 side. The element edge portions LE14 and LE24 are placed on the same plane PL.

For example, light emitting elements L1 and L2 in rows R1 and R4 are the first color CR1, light emitting elements L1 and L2 in rows R2 and R5 are the second color CR2, and light emitting elements L1 and L2 in row R3 are the third color CR3. Or, the first color CR1, second color CR2, and third color CR3 may be aligned along the first direction X or the second direction Y in this order. Or, the first color CR1, second color CR2, and third color CR3 may be arranged randomly.

Figure 11:
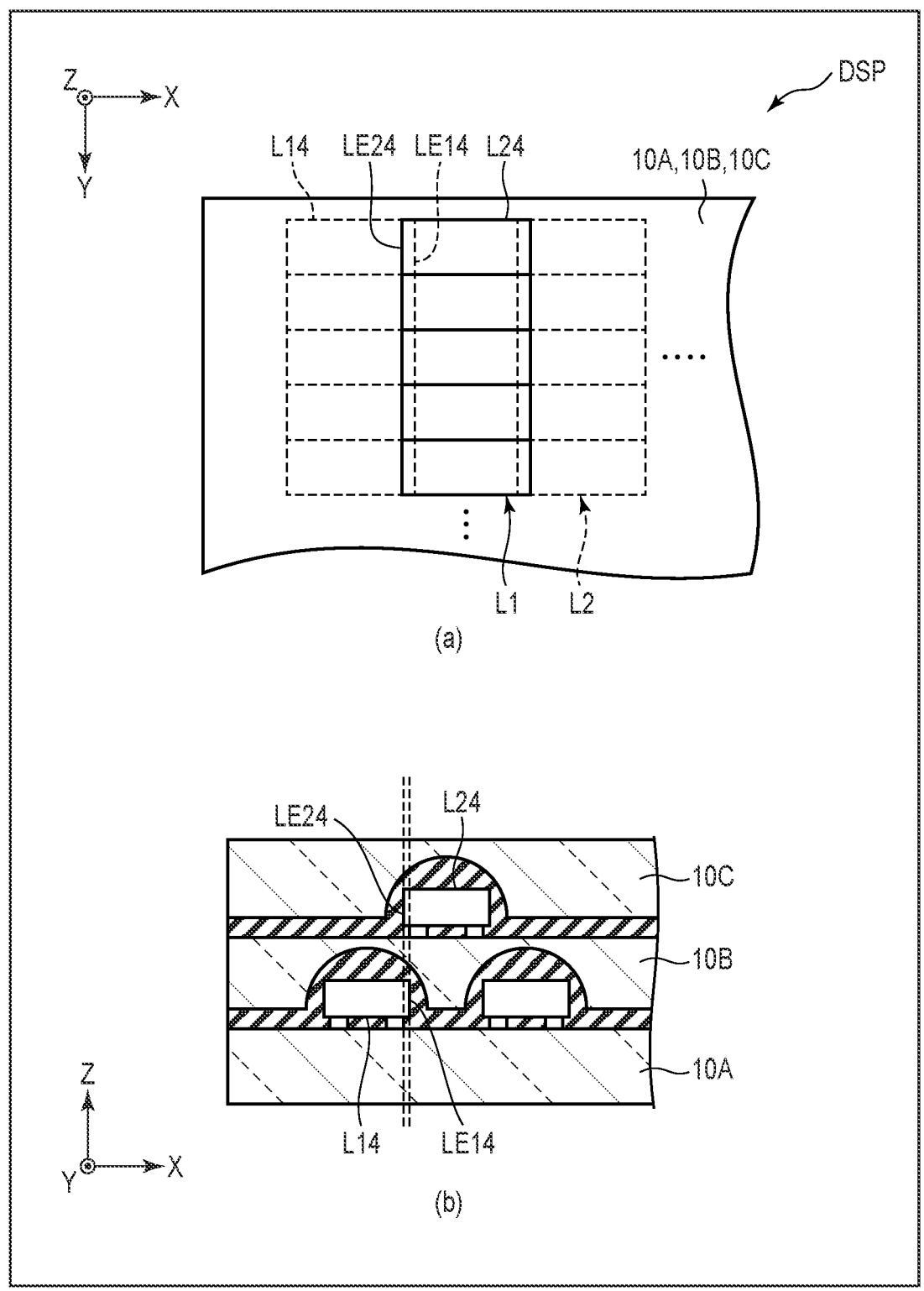
FIG. 11 is a diagram illustrating a sixth variant of the first embodiment.

FIG. 11 illustrates a sixth variant of the first embodiment. FIG. 11(a) is a plan view illustrating a part of the display device DSP, and FIG. 11(b) is a cross-sectional view of the display device DSP, taken along the first direction X. The structure of FIG. 11 indicates that the edge of the light emitting element L1 overlaps the light emitting element L2, and in this respect, it is different from the structure of FIG. 10. The element edge portion LE14 overlaps the light emitting element L24. Furthermore, the element edge portion LE24 overlaps the light emitting element L14.

Figure 12:
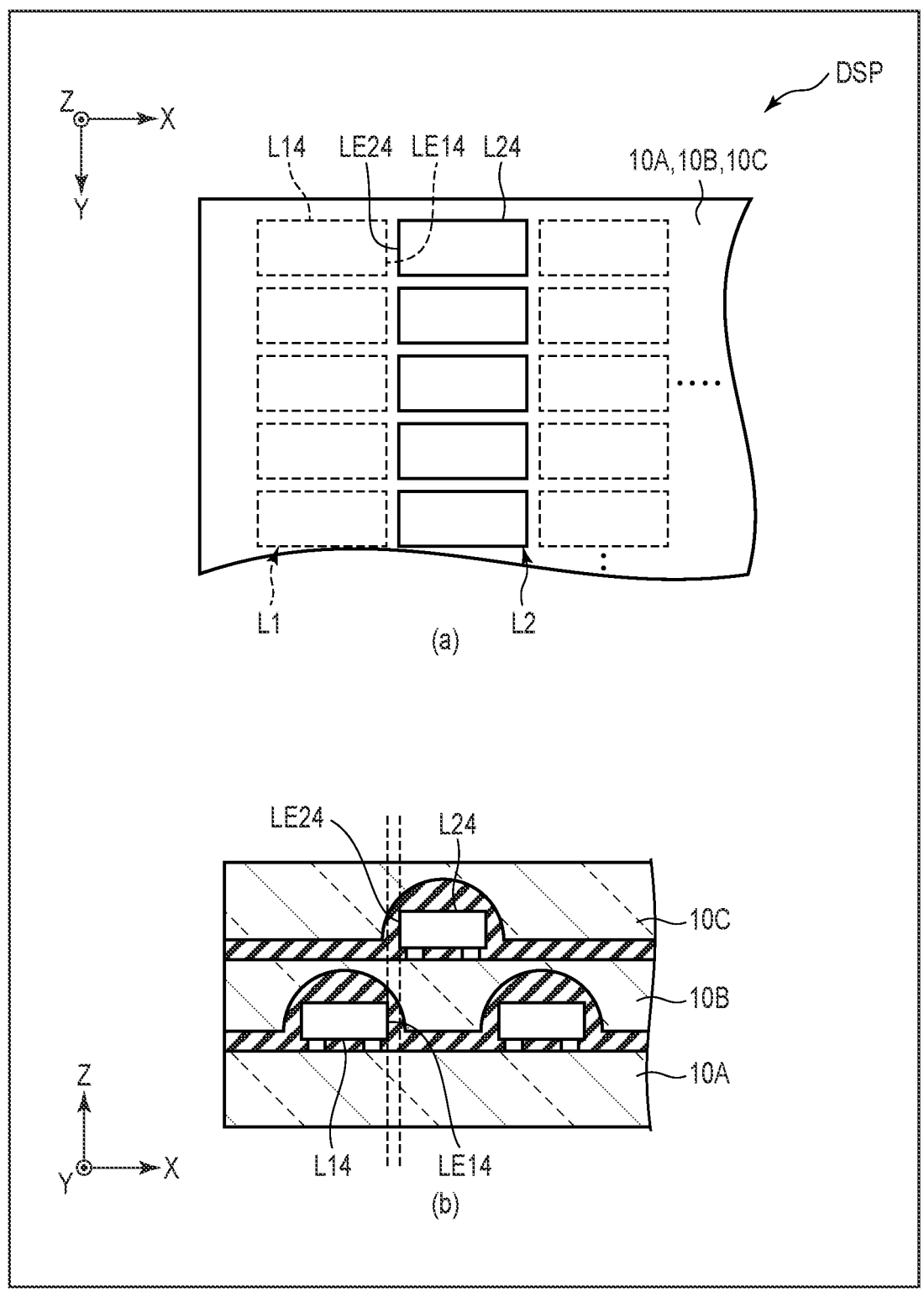
FIG. 12 is a diagram illustrating a seventh variant of the first embodiment.

FIG. 12 illustrates a seventh variant of the first embodiment. FIG. 12(a) is a plan view illustrating a part of the display device DSP, and FIG. 12(b) is a cross-sectional view of the display device DSP, taken along the first direction X. The structure of FIG. 12 indicates that the edge of the light emitting element L1 is apart from the edge of the light emitting element L2, and in this respect, it is different from the structure of FIG. 10. The element edge portion E14 and the element edge portion E24 are apart from each other in a plan view.

Figure 13:
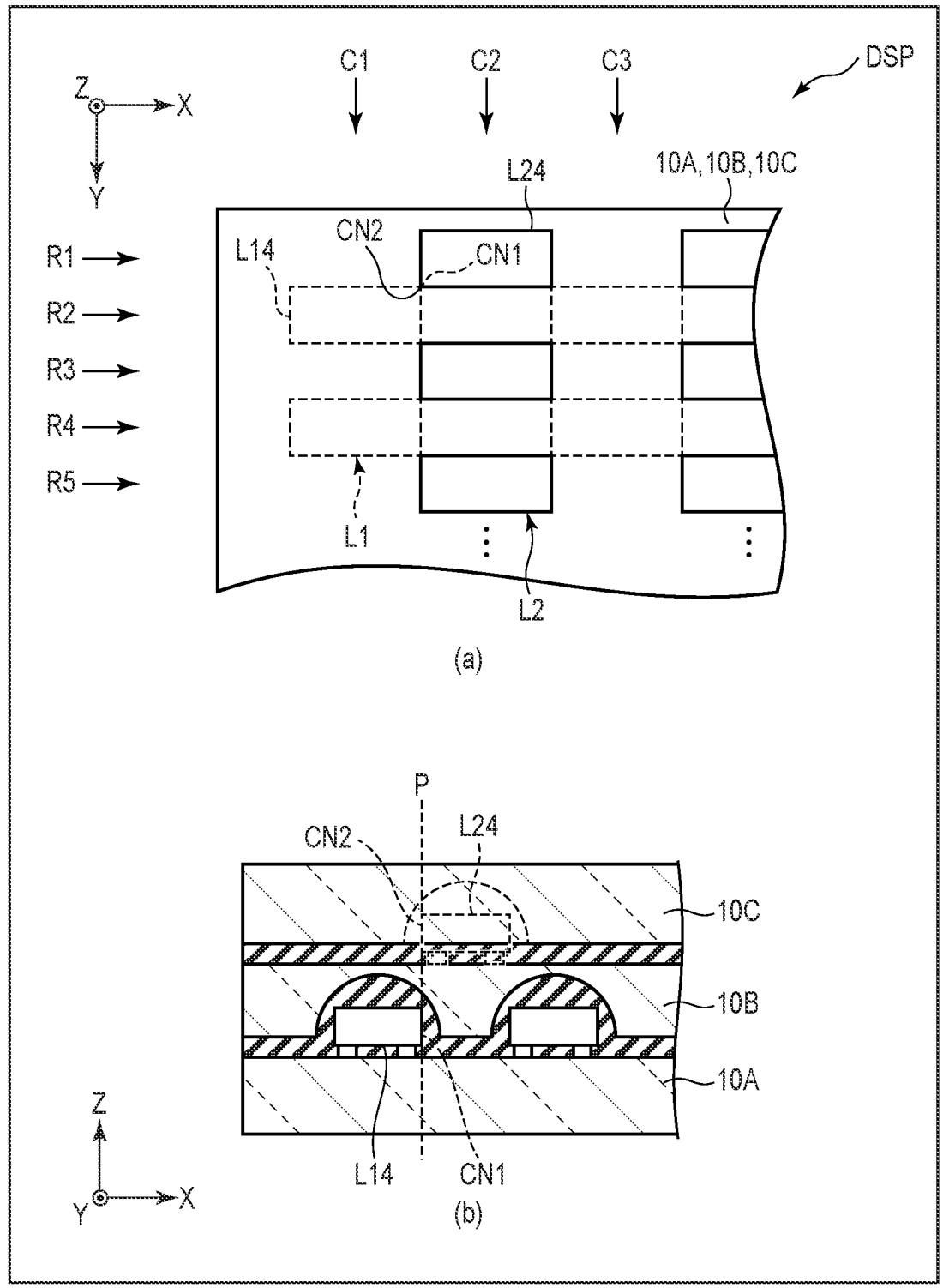
FIG. 13 is a diagram illustrating an eighth variant of the first embodiment.

FIG. 13 illustrates an eighth variant of the first embodiment. FIG. 13(a) is a plan view illustrating a part of the display device DSP, and FIG. 13(b) is a cross-sectional view of the display device DSP of FIG. 13(a), taken along the first direction X.

As in FIG. 13(a), in rows R1, R3, and R5, the light emitting elements L2 are aligned in the first direction X at intervals by one light emitting element therebetween. In rows R2 and R4, the light emitting elements L1 are aligned in the first direction X at intervals by one light emitting element therebetween. In columns C1 and C3, the light emitting elements L1 are aligned in the second direction Y at intervals by one light emitting element therebetween. In column C2, the light emitting elements L2 are aligned in the second direction Y at intervals by one light emitting element therebetween. That is, in a plan view, a plurality of light emitting elements L1 and L2 are arranged in a staggered manner. The light emitting element L14 includes a first corner portion CN1 in the light emitting element L14 side. The light emitting element L24 includes a second corner portion CN2 in the light emitting element L14 side. The first corner portion CN1 and the second corner portion CN2 are positioned on the same point P.

For example, light emitting elements L1 and L2 in columns C1 and C2 are the first color CR1, and the light emitting elements of same color are arranged in every two columns. Or, the first color CR1, second color CR2, and third color CR3 may be aligned along the first direction X or the second direction Y in this order. Or, the first color CR1, second color CR2, and third color CR3 may be arranged randomly.

Figure 14:
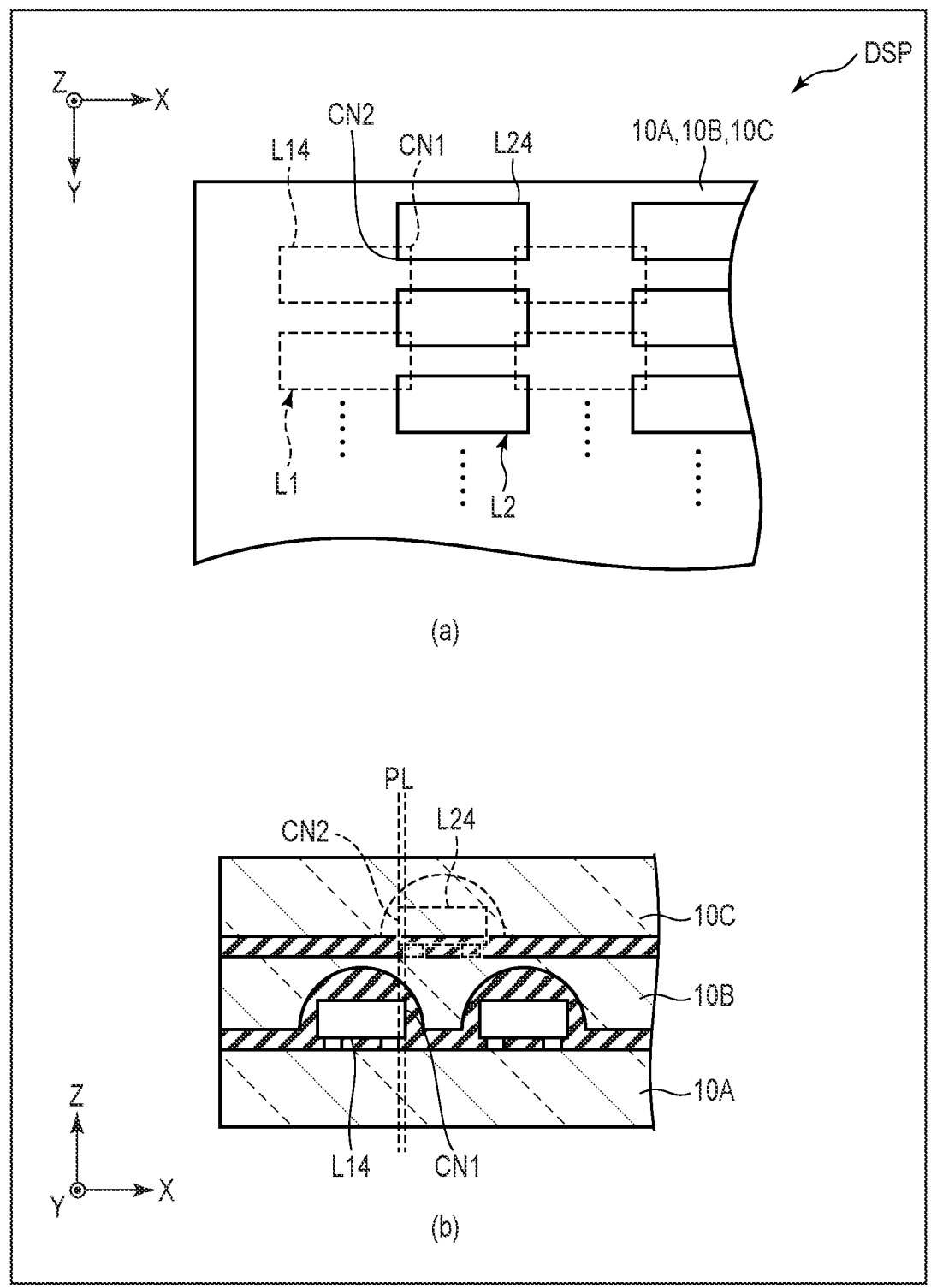
FIG. 14 is a diagram illustrating a ninth variant of the first embodiment.

FIG. 14 illustrates a ninth variant of the first embodiment. FIG. 14(a) is a plan view illustrating a part of the display device DSP, and FIG. 14(b) is a cross-sectional view of the display device DSP of FIG. 14(a), taken along the first direction X. The structure of FIG. 14 indicates that the corner portion of the light emitting element L1 overlaps the light emitting element L2, and in this respect, it is different from the structure of FIG. 13. The first corner portion CN1 overlaps the light emitting element L24, and the second corner portion CN2 overlaps the light emitting element L14.

Figure 15:
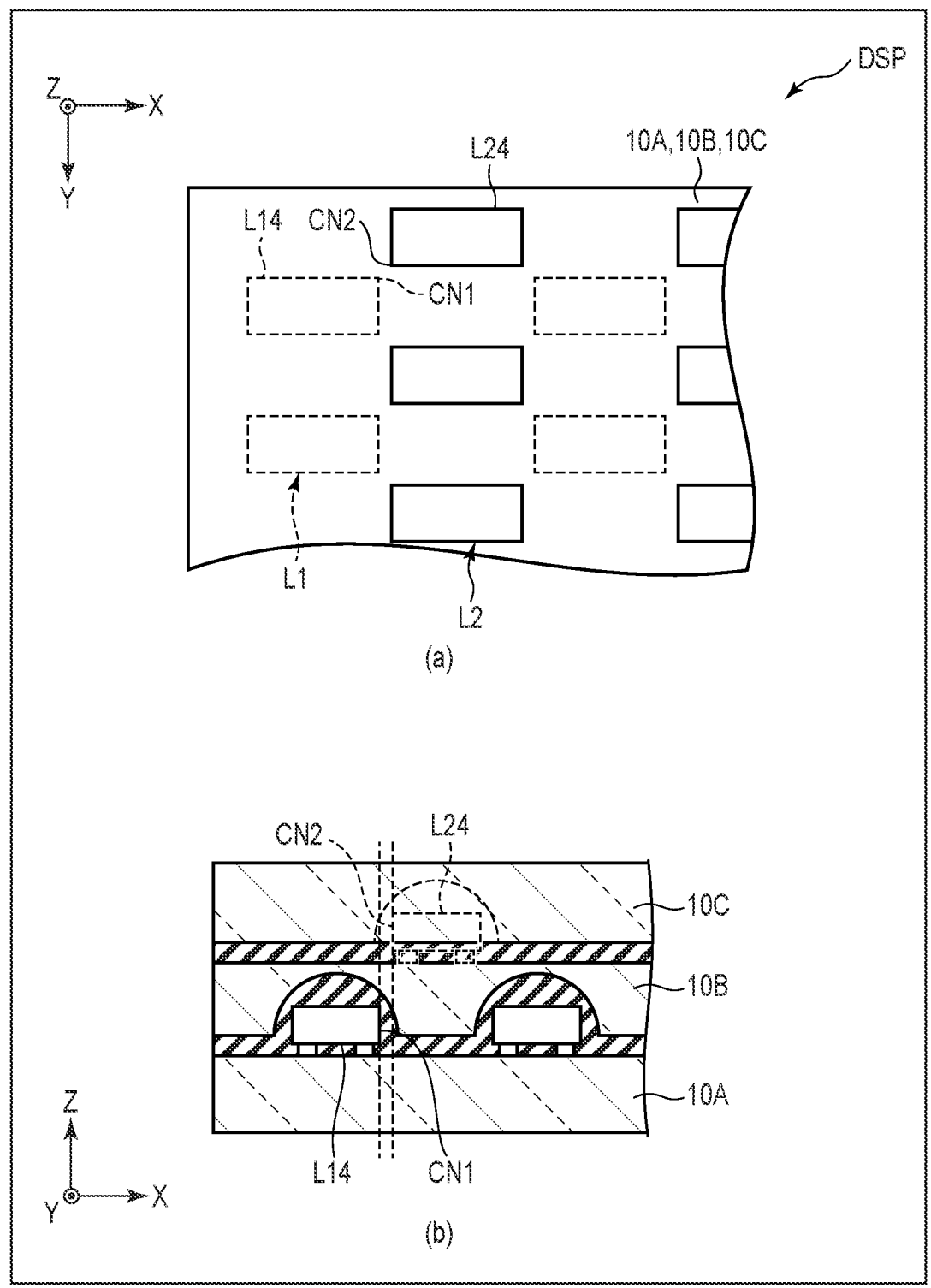
FIG. 15 is a diagram illustrating a tenth variant of the first embodiment.

FIG. 15 illustrates a tenth variant of the first embodiment. FIG. 15(a) is a plan view illustrating a part of the display device DSP, and FIG. 15(b) is a cross-sectional view of the display device DSP of FIG. 15(a), taken along the first direction X. The structure of FIG. 15 indicates that the corner portion of the light emitting element L1 is apart from the light emitting element L2, and in this respect, it is different from the structure of FIG. 13. The light emitting elements L14 and L24 are apart from each other in a plan view. The first corner portion CN1 and the second corner portion CN2 do not overlap with other light emitting elements, respectively.

Figure 16:
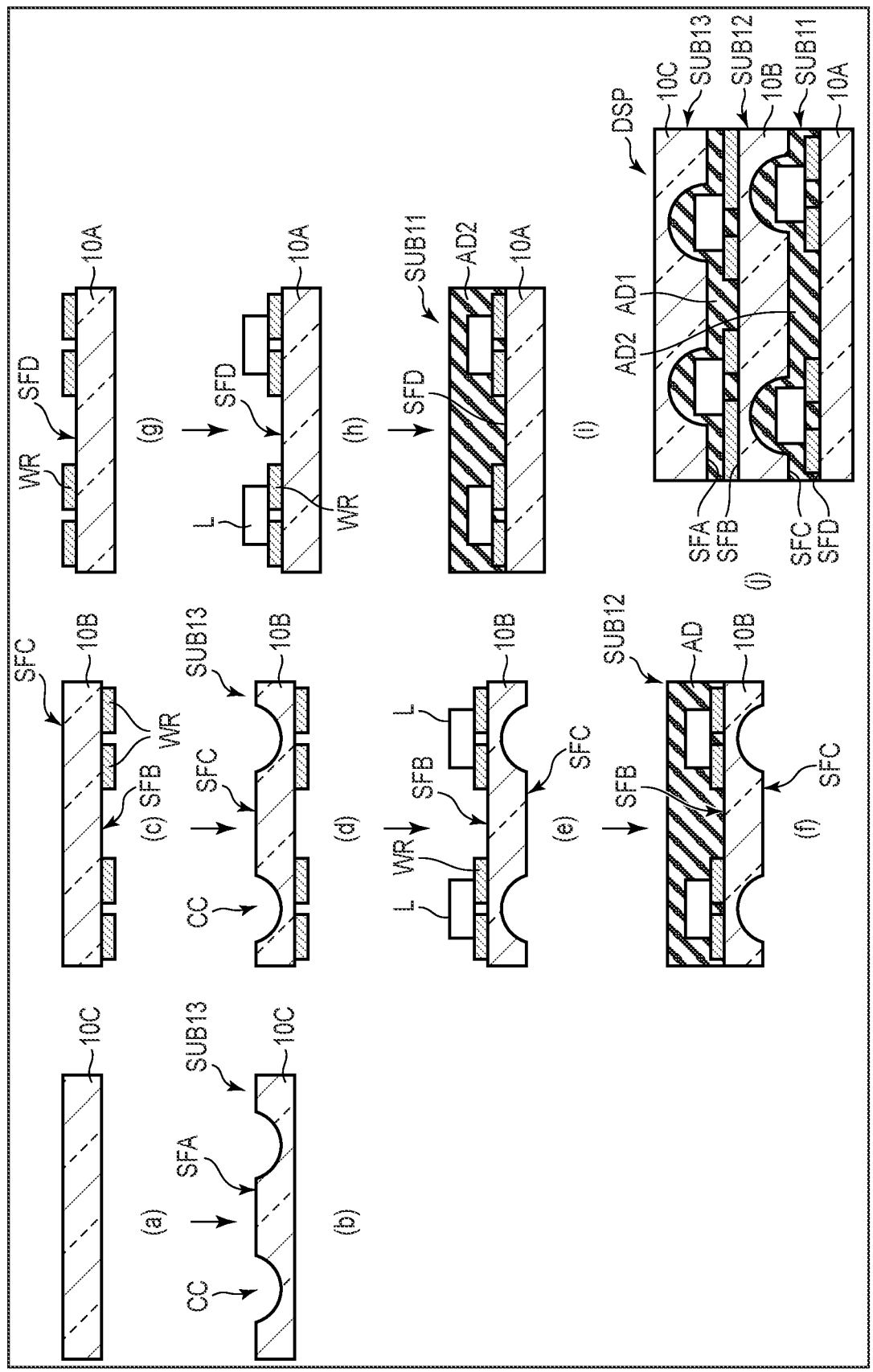
FIG. 16 is a schematic diagram illustrating a manufacturing process of the display device of the first embodiment.

FIG. 16 is a schematic view of a manufacturing process of the display device DSP of the first embodiment. The display device DSP is manufactured by stacking substrates SUB11, SUB12, and SUB13 together as in FIG. 16(j).

FIGS. 16(a) and 16(b) illustrate a process of forming the substrate SUB13. As in FIG. 16(a), an insulating substrate 10C is prepared. As in FIG. 16(b), concave portions CC are formed on a surface SFA of the insulating substrate 10C using physical or chemical treatment such as laser or etching.

FIGS. 16(c) to 16(f) illustrate a process of forming the substrate SUB12. As in FIG. 16(c), an insulating substrate 10B is prepared and lines WR and the like are formed on a surface SFB.

As in FIG. 16(d), concave portions CC are formed on a surface SFC of the insulating substrate 10B using laser or etching. As shown in FIG. 16(e), light emitting element L is mounted on the line WR on the surface SFB. As in FIG. 16(f), an adhesive layer AD1 is applied in the surface SFB side.

FIGS. 16(g) to 16(i) illustrate a process of forming the substrate SUB11. As in FIG. 16(g), an insulating substrate 10A is prepared and lines WR and the like are formed on a surface SFD. As in FIG. 16(h), light emitting element L is mounted on the line WR on the surface SFD. As in FIG. 16(i), an adhesive layer AD2 is applied in the surface SFD side.

The substrate SUB13 of FIG. 16(b), substrate SUB12 of FIG. 16(f), and substrate SUB11 of FIG. 16(i) are stacked together. At that time, the surfaces SFA and SFB face each other and are adhered together by the adhesive layer AD1. Furthermore, the surfaces SFC and SFD face each other and are adhered together by the adhesive layer AD2.

Second Embodiment

Now, a second embodiment will be explained. A display device DSP of the second embodiment displays images on both surfaces of the display device DSP, and in this respect, it is different from the display device DSP of the first embodiment.

Figure 17:
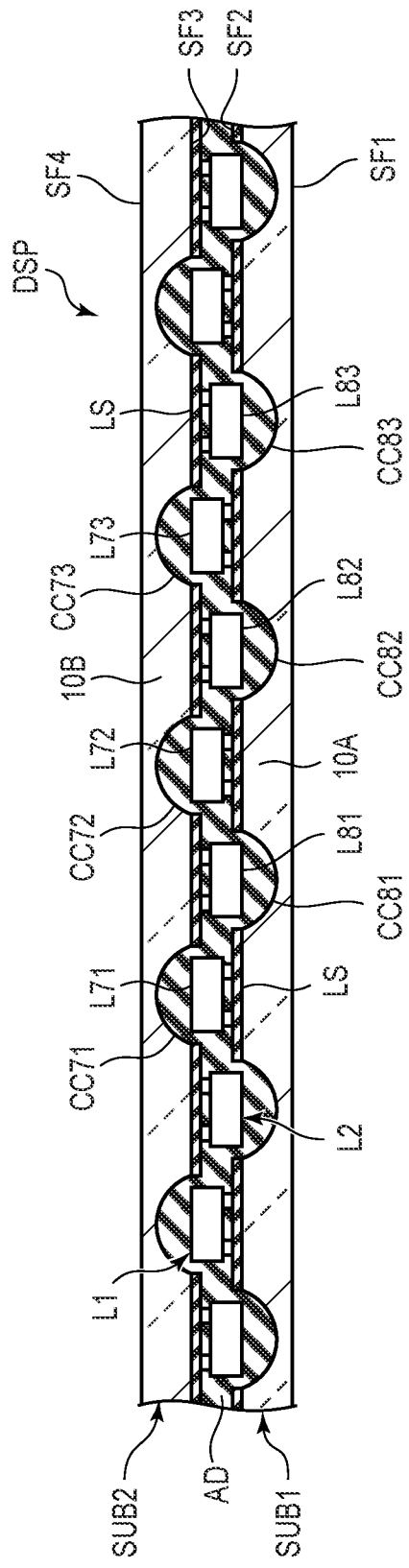
FIG. 17 is a schematic cross-sectional view of a display device of a second embodiment.

FIG. 17 is a schematic cross-sectional view of the display device DSP of the second embodiment.

The display device DSP includes a first substrate SUB1 and a second substrate SUB2. The first substrate SUB1 includes an insulating substrate 10A and a plurality of light emitting elements L1 mounted on the insulating substrate 10A. The second substrate SUB2 includes an insulating substrate 10B and a plurality of light emitting elements L2 mounted on the insulating substrate 10B. The insulating substrate 10A includes a first surface SF1 and a second surface SF2 in the opposite side of the first surface SF1. The insulating substrate 10B includes a third surface SF3 opposed to the second surface SF2 and a fourth surface SF4 in the opposite side of the third surface SF3. The first surface SF1 and the fourth surface SF4 correspond to display surfaces on which images are displayed.

Here, focusing on light emitting elements L71, L72, L73, L81, L82, and L83, the detailed structure of the display device DSP will be explained.

The light emitting elements L71, L72, and L73 are mounted on the second surface SF2. The Light emitting elements L81, L82, and L83 are mounted on the third surface SF3. The light emitting elements L71, L72, and L73 correspond to a plurality of light emitting elements L1 mounted on the insulating substrate 10A. The light emitting element L1 emits light toward the fourth surface SF4 side. The light emitting elements L81, L82, and L83 correspond to a plurality of light emitting elements L2 mounted on the insulating substrate 10B. The light emitting element L2 emits light toward the first surface SF1 side. The light emitting elements L71, L81, L72, L81, L82, and L83 are adjacent to each other in the first direction X in this order. A light shielding layer LS is positioned in the insulating substrate 10A side. Thus, light leakage to the insulating substrate 10A side can be suppressed when the light emitting element L1 is turned on. Furthermore, the light shielding layer LS is positioned in the insulating substrate 10B side of the light emitting element L2. Thus, light leakage to the insulating substrate 10B side can be suppressed when light emitting element L2 is turned on.

The insulating substrate 10B includes a concave portion CC71 in a position opposed to the light emitting element L71, concave portion CC72 in a position opposed to the light emitting element L72, and concave portion CC73 in a position opposed to the light emitting element L73. The concave portions CC71, CC72, and CC73 are formed in the third surface SF3. At least a part of the light emitting element L71 is positioned inside the concave portion CC71, at least a part of the light emitting element L72 is positioned inside the concave portion CC72, and at least a part of the light emitting element L73 is positioned inside the concave portion CC73.

The insulating substrate 10A includes a concave portion CC81 in a position opposed to the light emitting element L81, concave portion CC82 in a position opposed to the light emitting element L82, and concave portion CC83 in a position opposed to the light emitting element L83. The concave portions CC81, CC82, and CC83 are formed in the second surface SF2. At least a part of the light emitting element L81 is positioned inside the concave portion CC81, at least a part of the light emitting element L82 is positioned inside the concave portion CC82, and at least a part of the light emitting element L83 is positioned inside the concave portion CC83.

The display device DSP includes an adhesive layer AD adhering the second surface SF2 and the third surface SF3 together. The adhesive layer AD is positioned in the concave portions CC1, CC72, CC73, CC81, CC82, and CC83, and contacting the light emitting elements L71, L72, L73, L81, L82, and L83.

For example, the light emitting elements L71 and L81 emit a first color CR1, the light emitting elements L72 and L82 emit a second color CR2, and the light emitting elements L73 and L83 emit a third color CR3. That is, in the light emitting elements L1, the first, second, and third colors are aligned in this order. Furthermore, in the light emitting elements L2, the first, second, and third colors are aligned in this order. The adjacent light emitting elements L1 and L2 are the light emitting elements of same color. Or, the light emitting elements L71, L81, L72, L82, L73, and L83 may be aligned in the order of first, second, and third colors.

According to the second embodiment, the display device DSP can display images on the first surface SF1 and the fourth surface SF4. Furthermore, the insulating substrate 10A includes the concave portion CC in a position opposed to the light emitting element L2, the insulating substrate 10B includes the concave portion CC in a positioned opposed to the light emitting element L1. Since the light emitting element L1 is accommodated in the concave portion CC of the insulating substrate 10B, and the light emitting element L2 is accommodated in the concave portion CC of the insulating substrate 10A, the display device DSP can be formed thinner.

Figure 18:
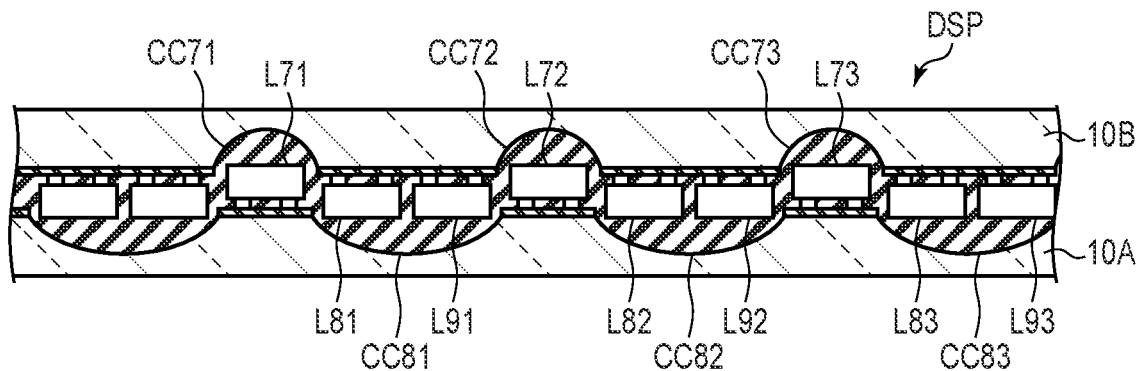
FIG. 18 is a diagram illustrating a first variant of the second embodiment.

FIG. 18 illustrates a first variant of the second embodiment. The structure of FIG. 18 indicates that the concave portions CC81, CC82, and CC83 further accommodate light emitting elements L91, L92, and L93, and in this respect, it is different from that of FIG. 17.

The light emitting elements L91, L92, and L93 are mounted on the third surface SF3. The Light emitting elements L91 is adjacent to the light emitting element L81, light emitting element L92 is adjacent to the light emitting element L82, and light emitting element L93 is adjacent to the light emitting element L83. At least a part of the light emitting element L91 is positioned inside the concave portion CC81 with the light emitting element L81. At least a part of the light emitting element L92 is positioned inside the concave portion CC82 with the light emitting element L82. At least a part of the light emitting element L93 is positioned inside the concave portion CC83 with the light emitting element L83. The concave portions CC81, CC82, and CC83 are formed greater than the concave portions CC71, CC72, and CC73, respectively. With such an arrangement, the number of light emitting elements emitting light toward the first surface SF1 side is greater than the number of light emitting elements emitting light toward the fourth surface SF4 side, and thus, the luminosity of the first surface SF1 becomes greater than that of the fourth surface SF4. That is, the luminosity of one surface is prioritized to be greater than that of the other surface.

For example, light emitting elements L71, L81, and L91 emit the first color CR1, light emitting elements L72, L82, and L92 emit the second color CR2, and light emitting elements L73, L83, and L93 emit the third color CR3. Or, the first color CR1, second color CR2, and third color CR3 may be arranged randomly.

Figure 19:
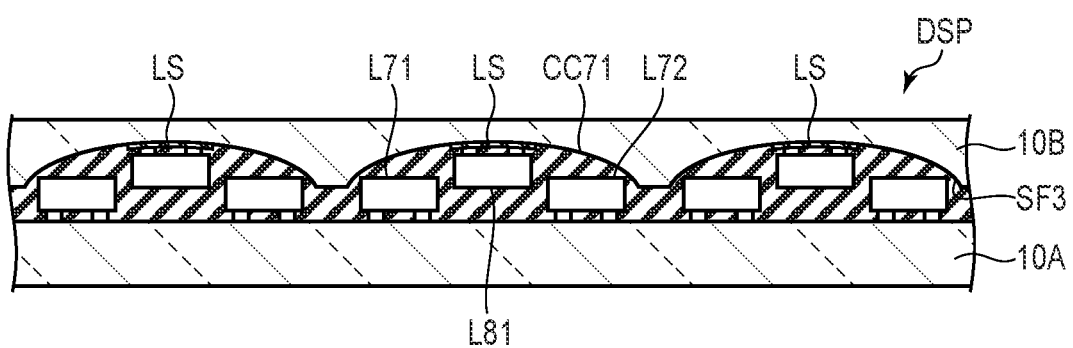
FIG. 19 is a diagram illustrating a second variant of the second embodiment.

FIG. 19 illustrates a second variant of the second embodiment. The structure of FIG. 19 indicates that the positional relationship between the concave portion CC and the light emitting element L is different from that of FIG. 17.

The light emitting element L81 is positioned between the light emitting elements L71 and L72. At least a part of the light emitting elements L71 and L72 is positioned inside the concave portion CC71. The light emitting element L81 is mounted inside the concave portion CC71 in the third surface SF3. In the second variant, the insulating substrate 10A does not include a concave portion CC. The concave portion CC may be formed in one insulating substrate 10B alone as above to mount the light emitting element L in the concave portion CC. According to the above structure, since the other insulating substrate 10A does not include a concave portion CC, decrease in physical strength of the display device DSP can be suppressed. Furthermore, a light shielding layer LS is positioned in the insulating substrate 10B side of the light emitting element L2 while the light shielding layer LS is formed inside the concave portion CC.

FIG. 20 illustrates a third variant of the second embodiment. FIG. 20(a) is a plan view illustrating a part of the display device DSP, and FIG. 20(b) is a cross-sectional view of the display device DSP of FIG. 20(a), taken along the second direction Y.

In FIG. 20(a), the light emitting element L1 mounted on the insulating substrate 10A is shown in a solid line, and light emitting element L2 mounted on the insulating substrate 10B is shown in a dotted line. The arrangement of the light emitting elements L1 and L2 of FIG. 20(a) is equal to that of FIG. 7(a). Here, focusing on the light emitting element L14 which is one of the light emitting elements L1 and the light emitting element L24 which is one of the light emitting elements L2, a positional relationship therebetween will be explained. The light emitting elements L14 and L24 are adjacent to each other in the second direction Y in a plan view. As in FIG. 20(b), the light emitting element L14 includes an element edge portion LE14 positioned in the light emitting element L24 side. The light emitting element L24 includes an element edge portion LE24 positioned in the light emitting element L14 side. The element edge portions LE14 and LE24 are placed on the same plane PL. Note that, the order of emitting colors of the light emitting elements L1 and L2 is the same as that of FIG. 7.

Figure 21:
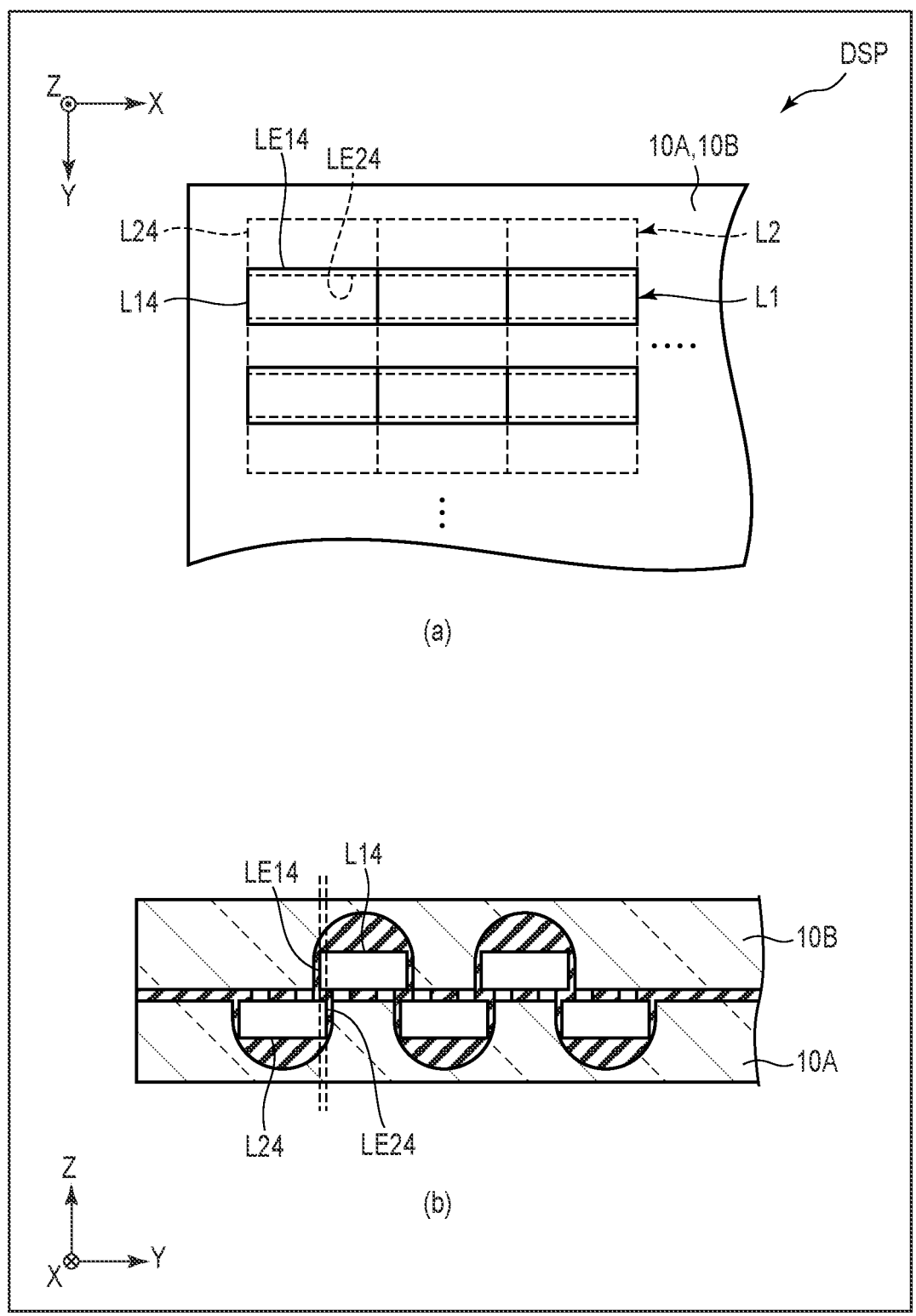
FIG. 21 is a diagram illustrating a fourth variant of the second embodiment.

FIG. 21 illustrates a fourth variant of the second embodiment. FIG. 21(a) is a plan view illustrating a part of the display device DSP, and FIG. 21(b) is a cross-sectional view of the display device DSP of FIG. 21(b), taken along the second direction Y. The structure of FIG. 21 indicates that the edge of the light emitting element L1 overlaps the light emitting element L2, and in this respect, it is different from the structure of FIG. 20. The element edge portion LE14 overlaps the light emitting element L24. Furthermore, the element edge portion LE24 overlaps the light emitting element L14.

FIG. 22 illustrates a fifth variant of the second embodiment. FIG. 22(a) is a plan view illustrating a part of the display device DSP, and FIG. 22(b) is a cross-sectional view of the display device DSP of FIG. 22(a), taken along the second direction Y. The structure of FIG. 22 indicates that the edge of the light emitting element L1 is apart from the edge of the light emitting element L2, and in this respect, it is different from the structure of FIG. 20. The element edge portion E14 and the element edge portion E24 are apart from each other in a plan view.

Figure 23:
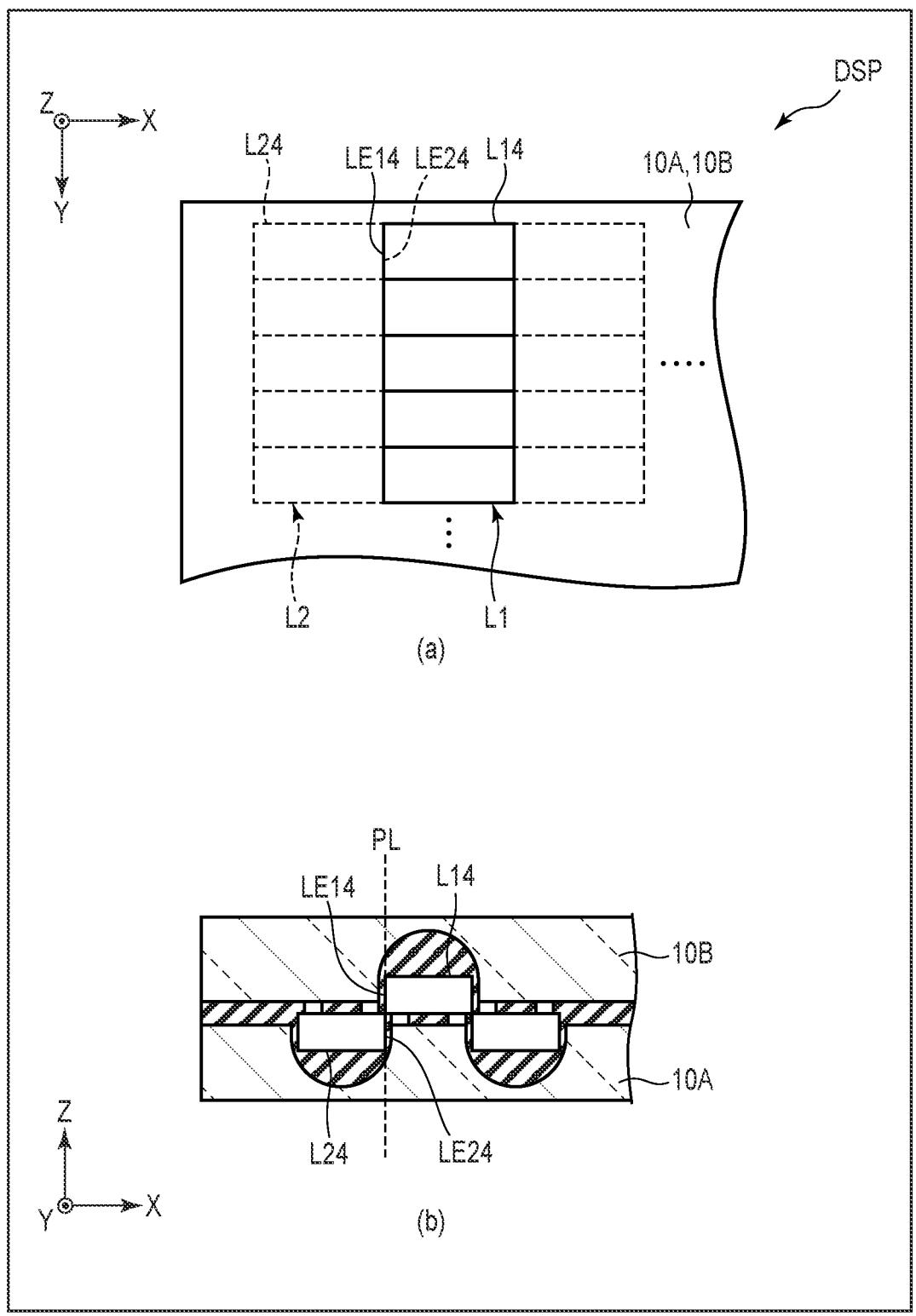
FIG. 23 is a diagram illustrating a sixth variant of the second embodiment.

FIG. 23 illustrates a sixth variant of the second embodiment. FIG. 23(a) is a plan view illustrating a part of the display device DSP, and FIG. 23(b) is a cross-sectional view of the display device DSP of FIG. 23(a), taken along the first direction X.

The arrangement of the light emitting elements L1 and L2 of FIG. 23(a) is equal to that of FIG. 10(a). The light emitting elements L14 and L24 are adjacent to each other in the first direction X in a plan view. As in FIG. 23(b), the light emitting element L14 includes an element edge portion LE14 positioned in the light emitting element L24 side. The light emitting element L24 includes an element edge portion LE24 positioned in the light emitting element L14 side. The element edge portions LE14 and LE24 are placed on the same plane PL. Note that, the order of emitting colors of the light emitting elements L1 and L2 is the same as that of FIG. 10.

Figure 24:
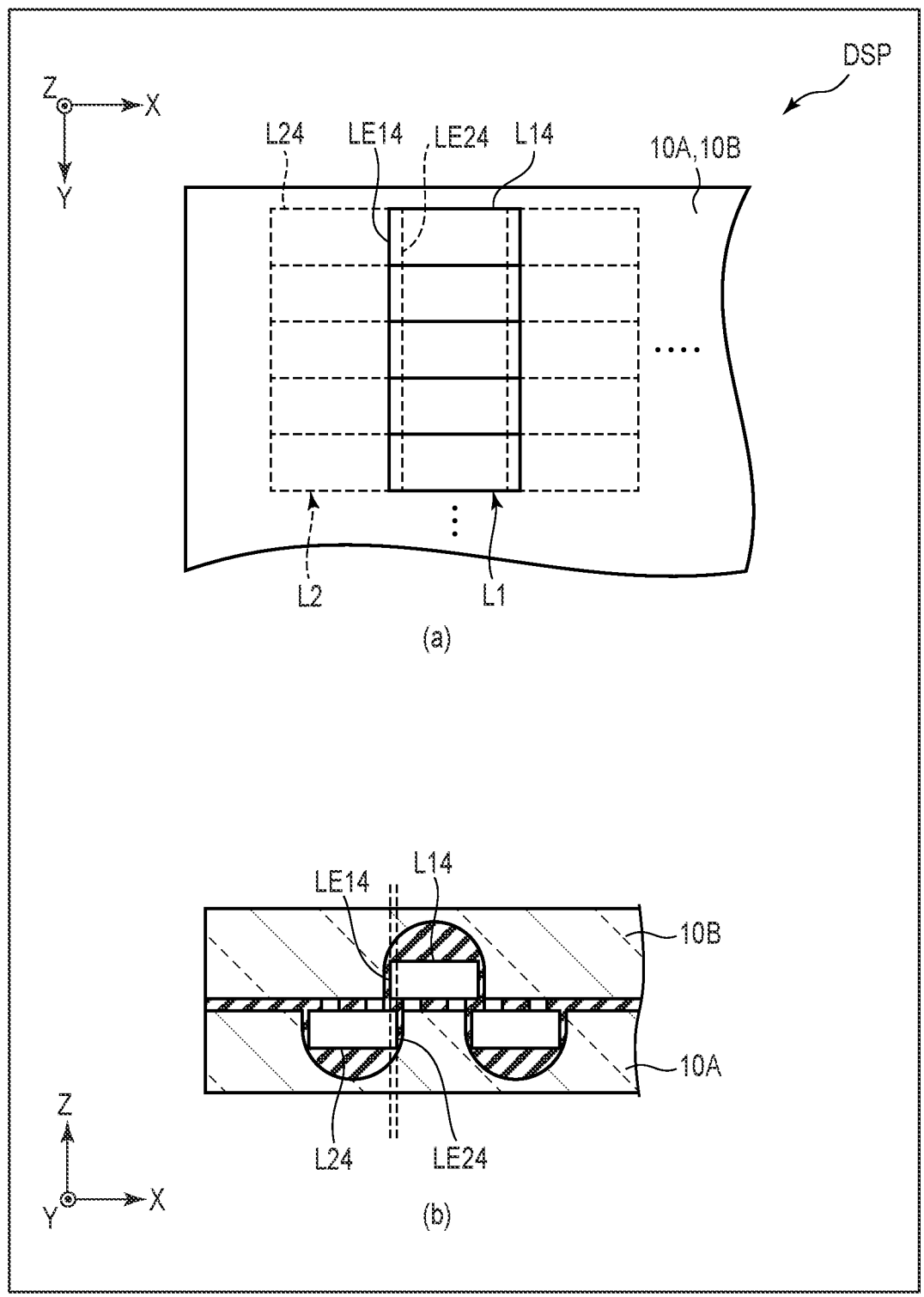
FIG. 24 is a diagram illustrating a seventh variant of the second embodiment.

FIG. 24 illustrates a seventh variant of the second embodiment. FIG. 24(a) is a plan view illustrating a part of the display device DSP, and FIG. 24(b) is a cross-sectional view of the display device DSP of FIG. 24(a), taken along the first direction X. The structure of FIG. 24 indicates that the edge of the light emitting element L1 overlaps the light emitting element L2, and in this respect, it is different from the structure of FIG. 23. The element edge portion LE14 overlaps the light emitting element L24. Furthermore, the element edge portion LE24 overlaps the light emitting element L14.

FIG. 25 illustrates an eighth variant of the second embodiment. FIG. 25(a) is a plan view illustrating a part of the display device DSP, and FIG. 25(b) is a cross-sectional view of the display device DSP of FIG. 25(a), taken along the first direction X. The structure of FIG. 25 indicates that the edge of the light emitting element L1 is apart from the edge of the light emitting element L2, and in this respect, it is different from the structure of FIG. 23. The element edge portion E14 and the element edge portion E24 are apart from each other in a plan view.

FIG. 26 illustrates a ninth variant of the second embodiment. FIG. 26(a) is a plan view illustrating a part of the display device DSP, and FIG. 26(b) is a cross-sectional view of the display device DSP of FIG. 26(a), taken along the first direction X.

The arrangement of the light emitting elements L1 and L2 of FIG. 26(a) is equal to that of FIG. 13(a). A plurality of light emitting elements L1 and L2 are arranged in a staggered manner. The light emitting element L14 includes a first corner portion CN1 in the light emitting element L24 side. The light emitting element L24 includes a second corner portion CN2 in the light emitting element L14 side. The first corner portion CN1 and the second corner portion CN2 are positioned on the same point P. Note that, the order of emitting colors of the light emitting elements L1 and L2 is the same as that of FIG. 13.

Figure 27:
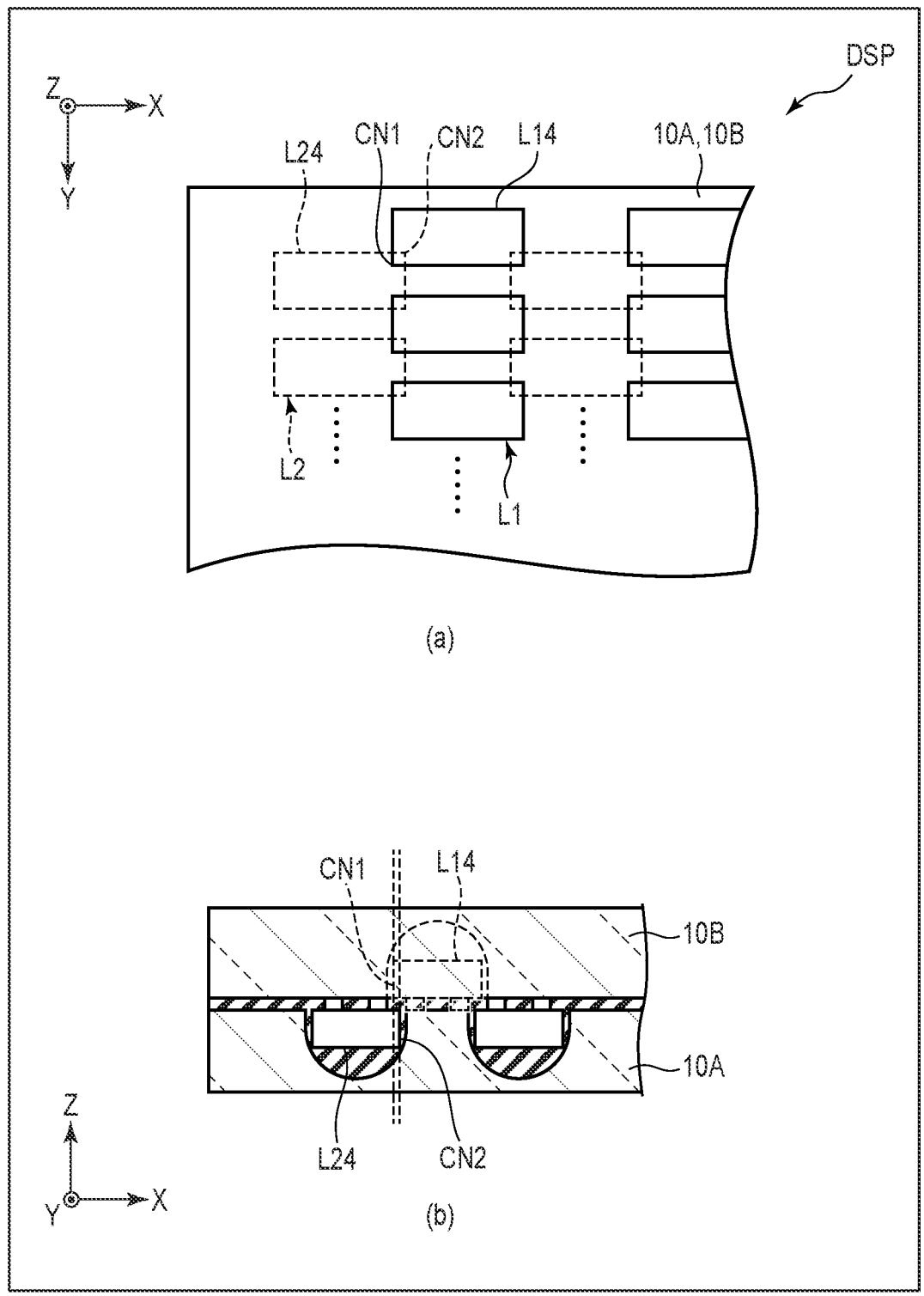
FIG. 27 is a diagram illustrating a tenth variant of the second embodiment.

FIG. 27 illustrates a tenth variant of the second embodiment. FIG. 27(a) is a plan view illustrating a part of the display device DSP, and FIG. 27(b) is a cross-sectional view of the display device DSP of FIG. 27(a), taken along the first direction X. The structure of FIG. 27 indicates that the corner portion of the light emitting element L1 overlaps the light emitting element L2, and in this respect, it is different from the structure of FIG. 26. The first corner portion CN1 overlaps the light emitting element L24, and the second corner portion CN2 overlaps the light emitting element L14.

FIG. 28 illustrates an eleventh variant of the second embodiment. FIG. 28(a) is a plan view illustrating a part of the display device DSP, and FIG. 28(b) is a cross-sectional view of the display device DSP of FIG. 28(a), taken along the first direction X. The structure of FIG. 28 indicates that the corner portion of the light emitting element L1 is apart from the light emitting element L2, and in this respect, it is different from the structure of FIG. 26. The light emitting elements L14 and L24 are apart from each other in a plan view. The first corner portion CN1 and the second corner portion CN2 do not overlap with other light emitting elements, respectively.

FIG. 29 is a schematic cross-sectional view of a manufacturing process of the display device DSP of the second embodiment. The display device DSP is manufactured by stacking substrates SUB21 and SUB22 together as in FIG. 29(h).

FIGS. 29(a) to 29(d) illustrate a process of forming the substrate SUB21. As in FIG. 29(a), an insulating substrate 10A is prepared, and lines WR and the like are formed on a surface SFA of the insulating substrate 10A. As in FIG. 29(b), concave portions CC are formed on the surface SFA using physical or chemical treatment such as laser or etching. As in FIG. 29(c), the light emitting element L is mounted on the line WR on the surface SFA. As in FIG. 29(d), an adhesive layer AD is applied in the surface SFA side.

FIGS. 29(e) to 29(g) illustrate a process of forming the substrate SUB22. As in FIG. 29(e), an insulating substrate 10B is prepared and lines WR and the like are formed on a surface SFB of the insulating substrate 10B. As in FIG. 29(f), concave portions CC are formed on the surface SFB using laser or etching. As shown in FIG. 29(g), the light emitting element L is mounted on the line WR on the surface SFB.

As in FIG. 29(h), the substrate SUB21 of FIG. 29(d) and the substrate SUB22 of FIG. 29(g) are adhered together. At that time, the surfaces SFA and SFB face each other and are adhered together by the adhesive layer AD.

As explained above, according to the present embodiment, a display device with improved functionality can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first insulating substrate including a first surface and a second surface which is an opposite side to the first surface;
a first light emitting element disposed on the second surface of the first insulating substrate;
a second insulating substrate including a third surface opposed to the second surface and a fourth surface which is an opposite side to the third surface;
a second light emitting element disposed on the second insulating substrate; and
a third insulating substrate including a fifth surface opposed to the fourth surface,
wherein
the second insulating substrate includes a first concave portion in the third surface in a position opposed to the first light emitting element, and a second concave portion in a position opposed to the second light emitting element,
at least a part of the first light emitting element is positioned inside the first concave portion,
at least a part of the second light emitting element is positioned inside the second concave portion,
the second light emitting element is positioned on the fourth surface of the second insulating substrate, and
the second concave portion is positioned in the fifth surface of the third insulating substrate.

2. The display device of claim 1, further comprising:
an adhesive layer adhering the second surface and the third surface, wherein
the adhesive layer is positioned inside the first concave portion and contacting the first light emitting element.

3. The display device of claim 1, further comprising:
a third light emitting element disposed on the second surface of the first insulating substrate, and adjacent to the first light emitting element; and
a fourth light emitting element disposed on the fourth surface of the second insulating substrate, and adjacent to the second light emitting element, wherein the second insulating substrate includes a third concave portion in the third surface at a position opposed to the third light emitting element,
at least a part of the third light emitting element is positioned inside the third concave portion,
the third insulating substrate includes a fourth concave portion in the fifth surface at a position opposed to the fourth light emitting element,
at least a part of the fourth light emitting element is positioned inside the fourth concave portion,
the first and second light emitting elements are adjacent to each other in a plan view and configured to emit light of a first color, and
the third and fourth light emitting elements are adjacent to each other in the plan view and configured to emit light of a second color.

4. The display device of claim 1, further comprising:
a third light emitting element disposed on the second surface of the first insulating substrate and adjacent to the first light emitting element; and
a fourth light emitting element disposed on the fourth surface of the second insulating substrate and adjacent to the second light emitting element, wherein
the second insulating substrate includes a third concave portion in the third surface at a position opposed to the third light emitting element,
at least a part of the third light emitting element is positioned inside the third concave portion,
the third insulating substrate includes a fourth concave portion in the fifth surface at a position opposed to the fourth light emitting element,
at least a part of the fourth light emitting element is positioned inside the fourth concave portion,
the first and second light emitting elements are adjacent to each other in a plan view,
the third and fourth light emitting elements are adjacent to each other in the plan view,
the first and third light emitting elements emit light of a first color, and
the second and fourth light emitting elements emit light of a second color.

5. The display device of claim 1, wherein
the first light emitting element includes a first element edge portion positioned in a second light emitting element side,
the second light emitting element includes a second element edge portion positioned in a first light emitting element side, and
the first and second element edge portions are positioned on a same plane.

6. The display device of claim 1, wherein
the first light emitting element includes a first element edge portion positioned in a second light emitting element side, and
the first element edge portion overlaps with the second light emitting element.

7. The display device of claim 1, wherein
the first light emitting element includes a first element edge portion positioned in a second light emitting element side,
the second light emitting element includes a second element edge portion positioned in a first light emitting element side, and
the first and second element edge portions are apart from each other in a plan view.

8. The display device of claim 1, wherein
a plurality of light emitting elements are arranged in a staggered manner in a plan view,
the first light emitting element includes a first corner portion in a second light emitting element side,
the second light emitting element includes a second corner portion in a first light emitting element side, and
the first corner portion and the second corner portion are positioned on a same point.

9. The display device of claim 1, wherein
a plurality of light emitting elements are arranged in a staggered manner in a plan view,
the first light emitting element includes a first corner portion in a second light emitting element side,
the second light emitting element includes a second corner portion in a first light emitting element side,
the first corner portion overlaps with the second light emitting element, and
the second corner portion overlaps with the first light emitting element.

10. The display device of claim 1, wherein
a plurality of light emitting elements are arranged in a staggered manner in a plan view, and
the first and second light emitting elements are apart from each other in the plan view.

11. The display device of claim 1, wherein
the second light emitting element is disposed on the third surface of the second insulating substrate, and
the second concave portion is positioned in the second surface of the first insulating substrate.

12. The display device of claim 11, further comprising:
a fifth light emitting element disposed on the third surface of the second insulating substrate and adjacent to the second light emitting element, wherein
at least a part of the fifth light emitting element is positioned inside the second concave portion with the second light emitting element.

13. The display device of claim 11, wherein
the first light emitting element includes a first element edge portion positioned in a second light emitting element side,
the second light emitting element includes a second element edge portion positioned in a first light emitting element side, and
the first and second element edge portions are positioned on a same plane.

14. The display device of claim 11, wherein
the first light emitting element includes a first element edge portion positioned in a second light emitting element side, and
the first element edge portion overlaps with the second light emitting element.

15. The display device of claim 11, wherein
the first light emitting element includes a first element edge portion positioned in a second light emitting element side,
the second light emitting element includes a second element edge portion positioned in a first light emitting element side, and
the first and second element edge portions are apart from each other in a plan view.

16. The display device of claim 1, wherein the first concave portion has an elliptic shape in a plan view, and accommodates the first light emitting element.

17. The display device of claim 1, further comprising:
an eighth light emitting element which is adjacent to the first light emitting element, wherein the second insulating substrate includes a first substrate end portion and a second substrate end portion which is an opposite side to the first substrate end portion, and the first concave portion extends from the first substrate end portion to the second substrate end portion, and accommodates at least the first and eighth light emitting elements.

18. The display device of claim 1, further comprising:
a sixth light emitting element disposed on the second surface of the first insulating substrate, and
a seventh light emitting element disposed on the third surface of the second insulating substrate and positioned between the first and sixth light emitting elements, wherein
at least a part of the sixth light emitting element is positioned inside the first concave portion, and
the seventh light emitting element is positioned inside the first concave portion.

19. A display device comprising:
a first insulating substrate including a first surface and a second surface which is an opposite side to the first surface;
a first light emitting element disposed on the second surface of the first insulating substrate;
a second insulating substrate including a third surface opposed to the second surface and a fourth surface which is an opposite side to the third surface;
a second light emitting element disposed on the second insulating substrate; and
an adhesive layer adhering the second surface and the third surface,
wherein
the second insulating substrate includes a first concave portion in the third surface in a position opposed to the first light emitting element, and a second concave portion in a position opposed to the second light emitting element, at least a part of the first light emitting element is positioned inside the first concave portion,
at least a part of the second light emitting element is positioned inside the second concave portion, and
the adhesive layer is positioned inside the first concave portion and contacting the first light emitting element.

20. A display device comprising:
a first insulating substrate including a first surface and a second surface which is an opposite side to the first surface;
a first light emitting element disposed on the second surface of the first insulating substrate;
a second insulating substrate including a third surface opposed to the second surface and a fourth surface which is an opposite side to the third surface; and
a second light emitting element disposed on the second insulating substrate,
wherein
the second insulating substrate includes a first concave portion in the third surface in a position opposed to the first light emitting element, and a second concave portion in a position opposed to the second light emitting element,
at least a part of the first light emitting element is positioned inside the first concave portion,
at least a part of the second light emitting element is positioned inside the second concave portion,
the second light emitting element is disposed on the third surface of the second insulating substrate,
the second concave portion is positioned in the second surface of the first insulating substrate,
the first light emitting element includes a first element edge portion positioned in a second light emitting element side, and
the first element edge portion overlaps with the second light emitting element.

* * * * *